United States Patent
Miyanaga et al.

(10) Patent No.: US 6,800,360 B2
(45) Date of Patent: Oct. 5, 2004

(54) POROUS CERAMICS AND METHOD OF PREPARING THE SAME AS WELL AS MICROSTRIP SUBSTRATE

(75) Inventors: Michimasa Miyanaga, Itami (JP); Noboru Uchimura, Itami (JP); Osamu Komura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/258,902

(22) PCT Filed: Feb. 5, 2002

(86) PCT No.: PCT/JP02/00937

§ 371 (c)(1),
(2), (4) Date: Oct. 29, 2002

(87) PCT Pub. No.: WO02/062727

PCT Pub. Date: Aug. 15, 2002

(65) Prior Publication Data

US 2004/0076806 A1 Apr. 22, 2004

(30) Foreign Application Priority Data

| Feb. 8, 2001 | (JP) | 2001-032245 |
| Jul. 31, 2001 | (JP) | 2001-232233 |
| Sep. 13, 2001 | (JP) | 2001-278086 |
| Jan. 16, 2002 | (JP) | 2002-006820 |
| Jan. 16, 2002 | (JP) | 2002-007096 |

(51) Int. Cl.$^7$ .............. B32B 3/00; H05K 1/00
(52) U.S. Cl. .......... 428/210; 428/209; 174/258
(58) Field of Search ................. 428/210, 209, 428/901; 174/258

(56) References Cited

U.S. PATENT DOCUMENTS

| 4,900,698 A | * | 2/1990 | Lundsager | 501/80 |
| 5,116,663 A | | 5/1992 | Fujimoto et al. | |
| 5,536,906 A | * | 7/1996 | Haas et al. | 174/52.4 |
| 5,866,240 A | * | 2/1999 | Prabhu et al. | 428/210 |

FOREIGN PATENT DOCUMENTS

| EP | 0758633 | 2/1997 |
| JP | 61-53146 | 3/1986 |
| JP | 1-033946 | 2/1989 |
| JP | 1-164783 | 6/1989 |
| JP | 1-215778 | 8/1989 |
| JP | 1-47435 | 10/1989 |
| JP | 03093301 | 4/1991 |
| JP | 03177376 | 6/1991 |
| JP | 03177372 | 8/1991 |
| JP | 4 088699 | 3/1992 |
| JP | 4-125990 | 4/1992 |
| JP | 05182518 | 7/1993 |

(List continued on next page.)

OTHER PUBLICATIONS

Detailed Explanation of Praxes•Exercises of Microwave Circuit by Genzaburo Kuraishi, 1983, issued by Tokyo Denki University Press; cover sheets and pp. 184 to 195.

*Primary Examiner*—Cathy Lam
(74) *Attorney, Agent, or Firm*—W. F. Fasse; W. G. Fasse

(57) ABSTRACT

Powder of a metal serving as a precursor for ceramics (1) and a sintering additive are mixed with each other and heat-treated by microwave heating thereby nitriding or oxidizing the metallic powder from the surface thereof and diffusing the metal with a nitride or an oxide formed on the shell of the metal for obtaining porous ceramics (1) having homogeneous and fine closed pores (1a). The porous ceramics (1) according to the present invention, having the closed pores (1a) homogeneously diffusing at a high ratio, exhibits excellent characteristics when applied to an electronic circuit board or the like requiring moisture absorption resistance, low permittivity and low dielectric loss as well as mechanical strength.

17 Claims, 5 Drawing Sheets

FOREIGN PATENT DOCUMENTS

| | | |
|---|---|---|
| JP | 05310469 | 11/1993 |
| JP | 06157157 | 6/1994 |
| JP | 06244298 | 9/1994 |
| JP | 08228105 | 9/1996 |
| JP | 08295576 | 11/1996 |
| JP | 09-249457 | 9/1997 |
| JP | 11-116333 | 4/1999 |
| JP | 2001172090 | 6/2001 |

\* cited by examiner

POROUS CERAMICS AND METHOD OF PREPARING THE SAME AS WELL AS MICROSTRIP SUBSTRATE

TECHNICAL FIELD

The present invention relates to porous ceramics and a method of preparing the same, and more specifically, it relates to porous ceramics for serving as an electrical insulating material applied to various types of wiring circuit boards or a lightweight structural material having moisture absorption resistance.

The present invention also relates to a microstrip substrate employed for forming a waveguide of a high frequency of at least 1 GHz, particularly at least 30 GHz, and more specifically, it relates to a microstrip substrate having a microstrip line consisting of a conductor formed on the surface of a substrate consisting of porous ceramics.

BACKGROUND ART

Improvements of characteristics such as further weight saving and improvement in strength or improvements of electrical characteristics are recently required to ceramics employed as various structural materials or electronic component materials. In a wafer transfer stage or a plotting stage used as a component of semiconductor equipment, for example, further weight saving of a stage material is required for high precision and high-speed driving. As to a circuit board or an insulating material employed for an electronic apparatus, a material having lower permittivity and lower dielectric loss is strongly required following recent improvement in frequency.

Therefore, it is conceivably effective to use ceramics in a porous state. When the relative density of ceramics is reduced to 50%, for example, the weight thereof can be reduced to 50%. Further, the air exhibits excellent electrical insulation properties with permittivity of about 1 and dielectric loss of zero, and hence porous ceramics attains desirable characteristics as a material to which low permittivity and low dielectric loss are required.

However, it is difficult to obtain a porous sintered body containing homogeneously dispersed fine pores simply by controlling a sintering step for a ceramic sintered body. In general, coarse pores are formed to disadvantageously reduce strength or result in heterogeneous characteristics. Further, most of pores forming the obtained porous sintered body are open pores deteriorating humidity resistance intrinsic to the ceramics, and desired characteristics cannot be attained in view of practicality due to remarkable deterioration of electrical characteristics (permittivity and dielectric loss) resulting from moisture, dispersion of various characteristics or the like.

Therefore, various methods are devised for obtaining a porous material consisting of fine closed pores. For example, Japanese Patent Laying-Open No. 3-177372 discloses an SiC-based porous sintered body containing a phase having a different thermal expansion coefficient to exhibit a total volume ratio of closed pores of 0.07 to 27.5%, in order to improve toughness. When this method is employed for obtaining an SiC-based porous sintered body having closed pores in a ratio of at least 27.5%, however, oxidation resistance is reduced or the pore sizes are increased.

Japanese Patent Laying-Open No. 5-310469.discloses a high-purity calcia sintered body exhibiting a ratio of 5 to 15% as to closed pores of 2 to 10 $\mu$m in diameter. This gazette states that this sintered body is obtained by mixing a foaming agent such as phenol aldehyde or flammable fine powder such as carbon black into muddy serosity of calcium carbonate and water and calcining the mixture. According to this method, however, residues of the foaming agent or the flammable fine powder remain in the closed pores while it is difficult to hold the shape if the amount of the foaming agent is increased, and hence the closed pore ratio cannot be increased.

Japanese Patent Laying-Open No. 6-157157 discloses lightweight and high-strength ceramics formed with closed pores prepared by equilibrating the pressure of the closed pores in the ceramics and the pressure in a calcinator. In this method, however, it is difficult to control the pore size.

According to Japanese Patent Laying-Open No. 11-116333, porous glass having closed pores of nanometer order is adjusted by phase-splitting borosilicate glass by heat treatment, eluting a soluble phase, performing pulverization and thereafter melting only the surface with a flame for forming closed pores. This gazette discloses a method of adjusting a mixture of glass, an aggregate and resin balls with a porous aggregate obtained by crystallizing/heat-treating the glass for preparing a ceramic circuit board by green sheet lamination. The ceramic circuit board obtained by this method exhibits relative permittivity of not more than 2 and a thermal expansion coefficient of 13 to 17 ppm/° C. This method is restricted to a material phase-split by heat treatment for eluting a soluble phase. Further, not only the process is complicated but also composition with a different phase is necessary, and hence intrinsic mechanical and electrical characteristics cannot be obtained. When open pores are temporarily exposed to the atmosphere to cause adsorption of moisture or the like, further, it is difficult to completely dissociate and control this.

In the aforementioned prior art forming closed pores, a second phase, such as a foaming agent, a melt or a phase having a different thermal expansion coefficient, different from the matrix phase must be added and hence electrical and mechanical characteristics are remarkably reduced due to the second phase or residues of the second phase. Further, the ratio and the size of formable pores are limited such that no matrix skeleton can be formed or the pore size cannot be controlled if the porosity is increased.

Porous ceramics, having excellent characteristics such as a light weight, heat insulating properties, excellent workability, high dimensional accuracy (fow shrinkage factor) in calcination, low permittivity and the like, can be expected for application to various structural materials, members for a filter and a vacuum chuck and electronic materials such as an insulating member (substrate), a low dielectric loss member (substrate) and the like.

However, porous ceramics having an irregular surface resulting from pores is insufficient in surface accuracy, and inferior in abrasion resistance and frictional characteristics or adhesion, flatness, film density (pinholes), dimensional accuracy and humidity resistance in a case of forming a functional thin film or a conductive pattern on the surface in application to the aforementioned usage.

As a method of smoothing the porous surface, therefore, there has been reported a method of grinding/polishing the surface similarly to dense ceramics or a method of impregnating the surface of a porous material with a ceramic slurry and thereafter sintering the same for densifying the surface (Japanese Patent Laying-Open No. 61-53146,Japanese Patent Laying-Open No. 1-164783, Japanese Patent Laying-Open No. 1-215778 or Japanese Patent Publication No. 1-47435).

When merely working the material by a method similar to that for a dense body, however, it is difficult to obtain a smooth surface of sub-micron order due to remaining irregularity resulting from pores. When ceramics or glass grains are simply deposited on the surface of porous ceramics, it is difficult to obtain a sufficiently flat surface, and reliability is deteriorated due to falling of the deposited grains or the like.

When a dense ceramic sheet is stacked on the surface of a porous material or the porous material is impregnated with a dense ceramic slurry and calcined, stress is caused in a dense region of the ceramics and the porous region due to a large shrinkage factor of the dense ceramic part, and hence the matrix is deformed (warped), a target dense layer is not formed or readily separated, or sufficient smoothness cannot be attained. The number of steps in the fabrication process is increased, to result in inferior productivity or the like.

As a conventional high-frequency circuit board, a dielectric substrate is employed as a relay substrate for connecting a package and an integrated circuit (IC) with each other or a substrate for a hybrid IC formed by mounting an IC, resistors, capacitors and the like on a substrate, as shown in "Detailed Explanation of Praxes-Exercises, of Microwave Circuit" by Genzaburo Kuraishi, 1983, issued by. Tokyo Denki University Press or Japanese Patent Laying-Open No. 6-244298, for example. Alumina ($Al_2O_3$), glass, epoxy resin or the like is employed as the material for the dielectric substrate applied to such usage.

Among these materials, alumina is mostly employed as the material for the substrate as to application in a high frequency band of microwaves and millimeter waves. Alumina is employed for the following reasons:

(i) A resin material such as epoxy resin, exhibiting lower relative permittivity as compared with alumina, exhibits heat resistance of only about 250° C. Therefore, the resin material cannot withstand a bonding temperature (about 320° C.) for an Au—Sn alloy generally employed as a brazing filler metal for bonding a microwave IC.

(ii) When employing a substrate consisting or an organic material having a dielectric dissipation factor (tanδ) of 10 to 100 times that of a ceramic material, transmission loss is increased.

An attempt of employing various dielectric substrates is made in order to reduce a propagation delay time particularly in a mother board for a computer. Such a substrate material is prepared by mixing a material such as glass or resin having low relative permittivity into conventional ceramics (alumina).

However, the relative permittivity of glass is 4 to 5 or 3.5 at the minimum, and hence reduction of the relative permittivity of the substrate for reducing the propagation delay time is limited when glass is mixed into the substrate material. When a resin material is mixed into the substrate material, heat resistance of alumina employed as the main material is disadvantageously reduced.

In an example disclosed in Japanese Patent Laying-Open No. 3-93301 or Japanese Patent Laying-Open No. 5-182518, an organic material such as porous plastic or polymer resin is employed as the material for a dielectric substrate. Even if the relative permittivity of the substrate can be reduced for reducing transmission loss such as a signal transmission delay time by employing such a material, however, heat resistance for bonding an IC chip or the like cannot be attained.

While a dielectric substrate consisting of alumina is generally employed in a high frequency band of microwaves and millimeter waves, alumina exhibiting extremely high relative permittivity of about 9 to 10 has the following problems:

(a) An unwanted mode of electromagnetic waves is generated in a part of the circuit board coming into contact with the air having relative permittivity of 1 due to the remarkable difference in relative permittivity, to result in transmission loss.

(b) In the high frequency band of millimeter waves or the like, a dielectric waveguide further miniaturizable as compared with a waveguide is employed as the basic element of an integrated circuit. While a large number of types of dielectric waveguides are present, a microstrip line is employed as a dielectric waveguide having a basic planar structure suitable for integration.

When strip conductors are adjacently formed on a dielectric substrate in such a microstrip line, however, bonding capacity between the adjacent conductors is disadvantageously increased to readily cause mutual interference.

(c) In order to set the characteristic impedance to 50 Ω in the microstrip line, the thickness of the dielectric substrate and the line width of the strip conductors must be set to 1:1. When employing a dielectric substrate having a small thickness, therefore, the line width of the strip conductors is inevitably reduced. Consequently, transmission loss is increased in the microstrip line while the precision of the line width exerts remarkable influence on fluctuation of the characteristic impedance.

According to the aforementioned "Detailed Explanation of Praxes Exercises of Microwave Circuit", p. 187, the characteristic impedance $Z_0$ can be calculated as follows:

$$a = \frac{1+1/\varepsilon_r}{2}, \frac{\Delta W}{t} = \frac{1}{\pi}\left[1+\ln\frac{4}{\sqrt{\left(\frac{t}{h}\right)^2 + \left\{\frac{1}{\pi\left(\frac{W}{t}+1.1\right)}\right\}^2}}\right]$$

$$W' = W + a\Delta W, b = \left(\frac{14+8/\varepsilon_r}{11}\right)\left(\frac{4h}{W'}\right)$$

$$Z_0 = \frac{42.4}{\sqrt{\varepsilon_r+1}}\ln\left\{1+\left(\frac{4h}{W'}\right)(b+\sqrt{b^2+a\pi^2})\right\}$$

where $\varepsilon_r$ represents the relative permittivity of the substrate, W represents the width of the line conductors (strip conductors), t represents the thickness of the line conductors and h represents the thickness of the dielectric substrate.

(d) According to p. 189 of the aforementioned literature, transmission loss in the microstrip line, more specifically the attenuation constant α, is given as follows:

$$a = \frac{72K}{WZ_0}\sqrt{\frac{f}{\sigma_T}} + 91f\sqrt{\varepsilon_{\mathit{eff}}}\frac{1-(1/\varepsilon_{\mathit{eff}})}{1-(1/\varepsilon_r)}\tan\delta\,[\mathrm{dB/m}]$$

where $\varepsilon_{\mathit{eff}}$ represents the effective relative permittivity of the line, $\varepsilon_r$ represents the relative permittivity of the dielectric substrate, tanδ represents the dielectric dissipation factor, $\sigma_T$ represents the specific conductivity of the conductors (specific conductivity of the conductors with reference to international standard soft copper ($\sigma = 5.8 \times 10^7$ [s/m])), and K represents a coefficient decided by the sectional structure of the microstrip line and the frequency.

As clearly understood from the above equations, the transmission loss, i.e., the attenuation constant α, is increased in proportion to the relative permittivity $\varepsilon_r$, the dielectric dissipation factor tanδ and the frequency f Thus, a material having the minimum relative permittivity must be selected as the substrate material in the high frequency band of the millimeter waves, in order to reduce transmission loss.

However, alumina having high relative permittivity of 9 to 10 increases transmission loss.

In consideration of handling in assembling, the strength of the microstrip substrate must be in excess of a constant value.

In order to solve these problems, Japanese Patent Laying-Open No. 8-228105, for example, discloses a technique of employing porous ceramics having open pores for a dielectric substrate. However, such porous ceramics having open pores also has the following problems:

(1) Airtightness and Dielectric Loss (i) It is difficult to control water absorption due to open pores, and reduction of reliability specific to the ceramics sometimes results from storage of water vapor or the like. Particularly in a high-frequency band, a small amount of moisture-absorbing component or OH groups formed on the surface result in remarkable dielectric loss. This is because water exhibits a remarkably large dielectric dissipation factor tanδ of 0.1 to 1 in a frequency band of at least 1 GHz and dielectric loss is increased in this case also when the permittivity is reduced.

(ii) A high-frequency package member or the like essentially requires hermetic sealing. However, a porous material formed by open pores has no airtightness and cannot be applied to usage requiring airtightness due to apprehension for discharge of adsorbed gas in usage or the like.

(2) Surface Roughness

It is difficult to flatten a porous body formed by open pores also when working the surface, and hence radiation loss is caused from the irregular surface or conductor loss on a surface conductor is so increased that it is difficult to attain precise circuit formation.

(3) Via Hole

When a matrix formed with a through hole filled up with metal paste is a porous body formed by open pores, the metal paste infiltrates into the portion other than the through hole to reduce insulation resistance or increase conductor loss.

For example, Japanese Patent Laying-Open No. 4-88699 or Japanese Patent Laying-Open No. 4-125990 discloses a method also employing a dense body in order to partially solve such problems related to the porous body. According to this method, however, it is difficult to completely ensure airtightness although the dense body compensates for the strength of the porous body, and dielectric loss is unavoidably increased due to temporarily formed surface groups or moisture absorption. Further, the dense layer and the porous layer have different shrinkage factors, leading to stress or cracking when these layers are stacked or combined with each other.

For example, Japanese Patent Laying-Open No. 64-33946 or Japanese Patent Laying-Open No. 3-177376 discloses a method dispersing a porous material into resin or impregnating the porous body with resin. However, employment of the resin results in reduction of heat resistance and high airtightness cannot be attained due to employment of the resin, while dielectric loss is relatively increased as compared with single ceramics. Further, the porous material must be subjected to specific treatment such as surface treatment.

DISCLOSURE OF THE INVENTION

An object of the present invention is to provide porous ceramics having homogeneous and fine closed pores and a method of preparing the same.

Another object of the present invention is to provide surface-smoothed porous ceramics preparable by a method excellent in productivity and a method of preparing the same.

Still another object of the present invention is to provide a microstrip substrate excellent in airtightness and heat resistance by reducing high-frequency transmission loss.

Porous ceramics according to a first aspect of the present invention has relative density of less than 70% with a ratio of closed pores of at least 50% among all pores. Further, the relative density is less than 50%, and the ratio of closed pores among all pores is at least 90%. While pores are defined between grains $101a$ in general porous ceramics 101 as schematically shown in FIG. 2, grains 1a are hollowed in porous ceramics according to the present invention as schematically shown in FIG. 1, and hence a dense part (skeletal part) has a continuous network structure. Further, the porous ceramics containing no coarse holes $1a$ has superior mechanical strength to the conventional porous ceramics 101, and attains high heat conductivity depending on conditions. Particularly in an arbitrary section of the porous ceramics 1 having such a structure that holes $1a$ of a uniform diameter are dispersed due to hollowing of grains, the radii r1 and r2 of a pair of adjacent holes $1a$ and the width b of the ceramic part 1 can be set to $(r1+r2)/b>1$. More preferably, $(r1+r2)/b>2$. The structural phase of the porous ceramics consists of ceramics and an oxynitride phase. Further, the said ceramics contains at least any material selected from a group consisting of silicon nitride, silicon oxide, aluminum nitride and aluminum oxide.

The present invention is also directed to a ceramic circuit board having at least a partial insulating layer consisting of the said porous ceramics.

The porous ceramics according to the present invention can be obtained by a method of preparing a green compact consisting of metallic powder forming a precursor for the porous ceramics and heat-treating the green compact in reactive gas. Further, porous ceramics consisting of hollowed ceramic grains can be obtained by heat-treating the said green compact under microwave irradiation. The metallic powder is silicon, and the porous ceramics is silicon nitride or silicon oxide. Alternatively, the metallic powder is aluminum, and the porous ceramics is aluminum nitride or aluminum oxide.

Porous ceramics according to a second aspect of the present invention consists of ceramics having surface roughness (Ra) of less than 0.5 μm and porosity of at least 30%.

Preferably in the aforementioned second aspect, the element forming the surface area of the ceramics includes the element forming the ceramics at a composition ratio different from the internal composition ratio of the ceramics.

Preferably in the aforementioned second aspect, the ceramics contains at least any material selected from a group consisting of alumina, silica, silicon nitride, aluminum nitride and silicon carbide.

Preferably in the aforementioned second aspect, the main phase of the ceramics is silicon nitride with aluminum (Al) contained in the surface area of the ceramics.

Preferably in the aforementioned second aspect, a thin film of a metal, an oxide or a nitride is formed on the surface.

Preferably in the aforementioned second aspect, a patterned metallic conductor is formed on the surface.

Preferably in the aforementioned second aspect, the surface of the porous ceramics is flattened by working the surface of the porous ceramics having porosity of at least 30% through solid phase reaction between abrasive grains and ceramics.

A microstrip substrate according to the present invention comprises a substrate, a microstrip line consisting of a conductor formed on the surface of the substrate and a base layer including at least a metallic plate or a metallized layer formed on the back surface of the substrate, and the substrate includes a ceramic porous body having porosity of at least 30% with a ratio of closed pores of at least 50% among all pores. The term porosity indicates the ratio of voids occupying the volume of the substrate.

In the microstrip substrate according to the present invention, the ceramic porous body is employed for the substrate. Thus, a substrate having heat resistance of at least 500° C. can be proposed. Further, a substrate having relative permittivity smaller than the relative permittivity of conventional glass ($SiO_2$) can be implemented by controlling the porosity of the ceramic porous body.

The porosity of the ceramic porous body is at least 30%. If the porosity is less than 30%, the relative permittivity exceeds the relative permittivity intrinsic to silica glass ($SiO_2$) depending on the material for the ceramic porous material, and relative permittivity lower than that of a dielectric substrate consisting of conventional glass cannot be implemented.

The ratio of closed pores among all pores is at least 50%, whereby water absorption can be readily controlled and dielectric loss resulting from water absorption or the like can be reduced while hermetic sealing is simplified and hence the microstrip substrate can be applied to usage requiring airtightness. The closed pores are at the high ratio of at least 50%, and hence the surface can be readily flatly worked for suppressing radiation loss from surface irregularity or conductor loss in a surface conductor. Also when a through hole is formed, metal paste can be inhibited from infiltrating into a part other than the through hole and conductor loss resulting therefrom can be suppressed.

The ratio of the closed pores is at least 50%, whereby a microstrip substrate containing no component such as resin or organic matter causing loss or airtightness inhibition, reducing transmission loss of a high frequency and having excellent airtightness and heat resistance can be obtained.

Further, the base layer provided on the back surface of the substrate can remarkably reinforce the strength of the substrate. Also in a material such as a porous body having low strength, therefore, constant strength necessary for handling in assembling can be ensured by providing the base layer.

Preferably in the aforementioned microstrip substrate, the base layer has a glass substrate, a metallized layer formed on the surface of the glass substrate and a second metallized layer formed on the back surface of the glass substrate, and the metallized layer is arranged to be in contact with the back surface of the substrate.

Thus, the base layer can be prepared from a material of any structure in order to reinforce the strength of the porous body.

Preferably in the aforementioned microstrip substrate, the ceramic porous body has porosity of at least 50% with the ratio of closed pores of at least 80%, more preferably at least 90%, among all pores.

Thus, a microstrip substrate containing no component such as resin or organic matter causing loss or airtightness inhibition, reducing transmission loss of a high frequency and having excellent airtightness and heat resistance can be formed.

Preferably in the aforementioned microstrip substrate, the ceramic porous body is prepared from ceramics including at least any material selected from a group consisting of aluminum oxide, silicon nitride and aluminum nitride.

This material is selected in view of mechanical strength, the dielectric dissipation factor (tanδ) and heat resistance. The ceramics forming the substrate may be formed by compositing at least two materials selected from the above.

When alumina, silicon nitride or silicon oxide is employed as the material for the ceramic porous body, the relative permittivity can be reduced along the porosity in principle, as shown in Table 1.

TABLE 1

| | Porosity A | | | | | | | | | |
|---|---|---|---|---|---|---|---|---|---|---|
| $\epsilon_r$ | 0.05 | 0.1 | 0.2 | 0.3 | 0.4 | 0.5 | 0.6 | 0.7 | 0.8 | 0.9 |
| Alumina (10) | 9 | 7.9 | 6.3 | 5.1 | 4 | 3.2 | 2.5 | 1.9 | 1.6 | 1.2 |
| $Si_3N_4$(7) | 6.4 | 5.8 | 4.7 | 3.9 | 3.2 | 2.6 | 2.2 | 1.8 | 1.5 | 1.2 |
| $SiO_2$(3.5) | 3.3 | 3.1 | 2.7 | 2.4 | 2.1 | 1.9 | 1.7 | 1.5 | 1.3 | 1.1 |

Preferably in the aforementioned microstrip substrate, the radii r1 and r2 of a pair of adjacent holes and the width b of a ceramic part satisfy relation (r1+r2)/b>1 in an arbitrary section of the ceramic porous body.

According to this structure, dielectric loss can be further reduced.

BEST MODES FOR CARRYING OUT THE INVENTION

Figure 1:
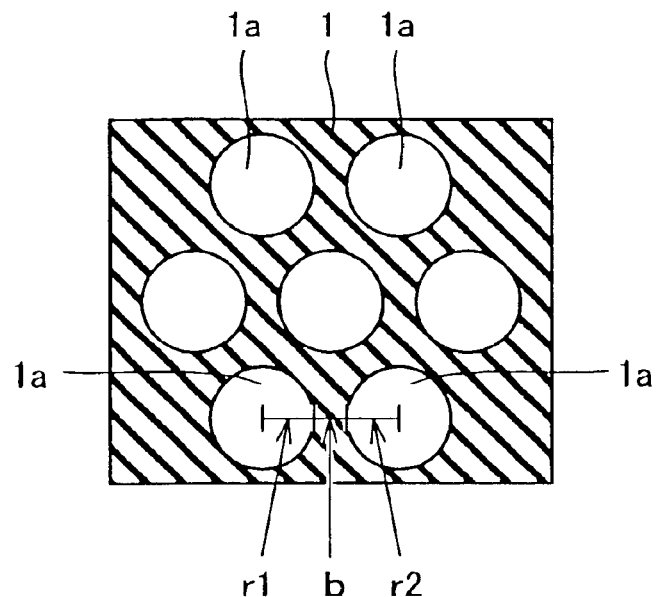
FIG. 1 is a model diagram of the sectional structure of porous ceramics according to the present invention.

Embodiments and Experimental Examples of the present invention are now described.

(First Embodiment)

Porous ceramics according to the present invention is now described in detail along with a method of preparing the same.

The porous ceramics according to the present invention is obtained by a method including steps of preparing metallic powder and sintering additive powder, mixing these powder materials with each other for forming mixed powder, molding the mixed powder into a green compact and sintering the green compact under an atmosphere containing nitrogen or oxygen into a sintered body of a metal nitride or a metal oxide. Closed pores are obtained by hollowing the metallic powder serving as a precursor for the ceramics. The relative density and the ratio of the closed pores among all pores can be controlled by the grain size of the metallic powder employed as the starting material. The metallic powder can be prepared from commercially available high-purity metallic powder. However, a natural oxide film or a thermal oxide film resulting from subsequent heat treatment is formed on the surface of the metallic powder. The degree of hollowing remarkably varies with the quantity of the oxide film in ceramics other than oxide ceramics, and hence it is important to control the oxygen content in the metallic powder. The oxygen content is preferably selected in the range of at least 0.4 mol % and not more than 1.5 mol % in terms of the metal oxide.

The mean grain size of the metallic powder is preferably at least 0.1 µm and not more than 15 µm. It is difficult to control the said oxygen content due to a large specific surface area if the mean grain size is less than 0.1 µm, while the reaction time for completely hollowing the metallic powder is uneconomically increased if the mean grain size exceeds 15 µm.

A rare earth oxide is added to the said metallic powder as the sintering additive. As to the rare earth oxide, at least one material selected from $Yb_2O_3$, $Sm_2O_3$, $Er_2O_3$, $Gd_2O_3$ and $Y_2O_3$ is preferably added to the metallic powder by at least 0.2 mol % and not more than 2.5 mol %. If the content of the rare earth oxide is less than 0.2 mol %, diffusion of the metal is not prompted and hollowing is insufficiently performed. If the content exceeds 2.5 mol %, the total porosity is readily reduced. $Fe_2O_3$ or $Al_2O_3$ generally known as the sintering additive for ceramics is unpreferable for the present invention due to insufficient hollowing. The mean grain size of the added sintering additive is preferably at least 0.1 µm and not more than 1 µm. The ceramics is hard to handle since aggregation or the like is readily caused if the mean grain size is less than 0.1 µm, while nitriding or oxidation of the metallic powder hardly progresses if the mean grain size exceeds 1 µm. When the oxide film on the surface of the metallic powder hinders the reaction, an alkaline metal, an alkaline earth metal or an oxide of such a metal is preferably added as a second sintering additive in addition to the aforementioned sintering additive. The content of the second sintering additive is preferably at least 0.1 mol % and not more than 1.5 mol %, and the mean grain size thereof is preferably at least 0.1 µm and not more than 2 µm.

The metallic powder and the sintering additive as well as an organic binder added at need are mixed with each other by an existing method such as ball milling or ultrasonic mixing, and dried after the mixing. Thereafter the mixture is molded into a prescribed shape, to obtain a green compact. A well-known method such as general dry press molding, extrusion molding, doctor blade molding or injection molding can be employed for this molding, and the a method most desirable in view of quality and production can be selected in response to the desired shape. The mixed powder may also be granulated into granules in advance of the molding, to be previously increased in bulk density and improved in moldability. The said organic binder is added in a case of further improving the moldability.

The said green compact is heat-treated in atmospheric gas containing nitrogen or oxygen thereby progressing nitriding or oxidizing the metal, so that individual metallic grains are hollowed and nitrides or oxides of the reacting adjacent metallic grains are integrated with each other and porous ceramics having fine closed pores can be obtained. As schematically shown in FIGS. 3A to 3C and 4A to 4D, the surfaces of the metallic grains are first nitrided or oxidized. When the heat treatment is progressed, it seems that the metal diffuses toward nitrides or oxides on the outer peripheries for progressing nitriding or oxidation and attaining hollowing. Therefore, parts of the metallic grains finally define holes. The degree of hollowing varies with the oxygen content in the metallic powder employed as the starting material, the type of the sintering additive or the heat treatment method. The size of the individual closed pores depends on the grain size of the metallic powder employed as the starting material, and hence the size of the closed pores is homogeneous if the grain size of the metallic powder is homogeneous, so that the ceramics contains no coarse closed pores.

The heat treatment can be carried out in a carbon heater furnace or the like. Heat treatment employing a microwave is preferable for prompting diffusion of the metallic powder and suppressing disappearance of the hollow structure resulting from grain growth. Particularly when the mixed powder is irradiated and heated with a microwave having a frequency of at least 20 GHz, diffusion of the metal into the metal nitrides or the metal oxides formed on the shells of the metallic grains can be further prompted, whereby the metallic grains can be preferably readily hollowed.

The preferable temperature range for the heat treatment temperature varies with the metallic powder employed as the starting material, and hence a case of obtaining porous ceramics of $Si_3N_4$ by nitriding Si is now described. The heat treatment temperature for nitriding Si is preferably at least 1200° C. If the heat treatment temperature is less than 1200° C., progress of nitriding of the metallic powder is uneconomically retarded. A temperature of not more than 1500° C. is preferable for heating with a carbon heater, and a temperature of not more than 1750° C. is preferable for microwave heating. A higher temperature results in phase transformation of the metal nitride or grain growth, and hence the hollowed structure is so changed that it is difficult to obtain the porous ceramics according to the present invention.

The temperature is preferably increased to the maximum level stepwise in at least two stages. This is because nitriding of the metal is exoergic reaction, and hence the temperature exceeds the melting point of the metal due to exothermic heat to melt the metal if the metal is heated to the final sintering temperature at once. The melted metal forms an unreacted melted block to result in coarse holes or elution from the green compact, disadvantageously leading to deterioration of mechanical and electrical characteristics of the porous ceramics. Also when another metallic powder is employed as the starting material or oxidized, the temperature is preferably increased stepwise in at least two stages, although temperature conditions are different.

The heat treatment is performed in a non-oxidizing atmosphere containing $N_2$ or $NH_3$, in order to obtain a nitride. Alternatively, an oxidizing atmosphere containing $O_2$ is employed in order to obtain an oxide. In either case, the pressure is not restricted but preferably set to at least 1 atom (101 kPa) and not more than 5 atoms (507 kPa).

In the porous ceramics according to the present invention obtained in the aforementioned manner, individual grains of the metallic powder are hollowed to provide a structure where holes of a uniform size are dispersed. The porous ceramics substantially consists of a single inorganic ceramic layer. Therefore, the porous ceramics is excellent in moisture absorption resistance and has low permittivity and low dielectric loss. The relative density is less than 70%, and the ratio of closed pores among all pores is at least 50%. Further, the relative density can be reduced to less than 50% and the ratio of the closed pores among all pores can be increased to 90% or more by selecting the mean grain size of the material metallic powder, the oxygen content on the surface, the type of the sintering additive and sintering conditions.

Assuming that r1 and r2 represent the radii of a pair of adjacent holes 1a and 2 represents the width of the ceramic part 1 in an arbitrary section of the porous ceramics according to the present invention as shown in FIG. 1, the relation (r1+r2)/b>1 is established. In other words, the diameter of the holes 1a can be set at least twice the thickness of the ceramic part 1 by properly selecting the mean grain size of the material metallic powder, the oxygen content on the surface, the type of the sintering additive and the sintering conditions. More preferably, (r1+r2)/b>2.

According to this structure, the dielectric loss can be further reduced. The dielectric loss of the porous ceramics according to the present invention is not more than about 10-4. Flexural strength measured by three-point bending as a mechanical characteristic is at least 150 MPa, and the porous ceramics has excellent electrical and mechanical characteristics.

While the material system for or the method of preparing the porous ceramics according to the present invention is not particularly restricted, the inventive porous ceramics is useful as a structural material or an electronic material particularly with reference to a material such as $Si_3N_4$, $SiO_2$, AlN or $Al_2O_3$. Porous ceramics having finely dispersed homogeneous holes can be readily obtained by employing metallic powder of Si or Al as the precursor for the ceramics and prompting diffusion of the metallic element into the shell in a reaction process of nitriding or oxidizing the metallic powder.

Experimental Examples related to this embodiment are now described.

EXPERIMENTAL EXAMPLE 1

Si powder having a mean grain size of 1 μm and each of rare earth oxides shown in Table 2, serving as a sintering additive, having a mean grain size of 0.8 μm were prepared. The rare earth oxide was prepared to be 0.8 mol % with respect to the Si powder. Each powder was prepared from a commercially available one. It was previously confirmed that the oxygen content on the surface of the Si powder measured by inert gas fusion and infrared detection was 0.7 mol % in terms of $SiO_2$. The prepared powder materials were mixed with each other in a ball mill for 24 hours with a solvent of ethyl alcohol. Thereafter the mixture was naturally dried and molded into φ23×3 mm and 4.5 by 7 by 45 mm by dry pressing. This green compact was held at a temperature of 1200° C. for 3 hours in a nitrogen atmosphere of the atmospheric pressure by microwave heating at a frequency of 28 GHz, thereafter heated to 1400° C. and held at this temperature for 3 hours. The green compact was heated in two stages since the temperature of silicon, which is nitrided by exoergic reaction ($Si+\frac{2}{3}N_2=\frac{1}{3}Si_3N_4+64$ kJ) at 1400° C., because 1400° C. or more due to its own heat generation if the same was heated to 1400° C. at once, to cause melting or the like. After natural cooling, the sintered body was finished to +20×1 mm and 3 by 4 by 40 mm with a peripheral grinder and a surface grinder. The characteristics of the finished sintered body were measured as described below. It was confirmed by X-ray diffraction that the sintered body entirely consisted of $Si_3N_4$ with no residual metallic Si.

Apparent density was calculated from the size and the weight of the sintered body while calculating theoretic density from the amount of the sintering additive according to the law of mixture, for obtaining the total porosity as follows:

(1—apparent density/theoretical density)×100 (%)

The volume of open pores was measured with a mercury porosimeter for calculating the ratio of the closed pores as follows:

(total pore volume−open pore volume)/total pore volume×100 (%)

The sintered body was cut and the section was polished for observing the radii r1 and r2 of adjacent holes and the thickness b of the ceramic part with an SEM. The center point of each hole was set as a point two-dimensionally defining the centroidal position through a scanning electron micrograph and the center points of arbitrary adjacent holes 1a were connected with each other as shown in FIG. 1, for measuring the radii r1 and r2 of the holes 1a and the thickness b of the ceramic part 1. Table 2 also shows the average of values measured on 50 portions.

The dielectric loss (tanδ) at 1 GHs was measured as the electrical characteristic by the method defined in JIS (Japanese Industrial Standard) C 2141. The sintered body was finished into the shape of the strength test piece defined in JIS R 1601 for measuring the three-point bending strength on the basis of the definition as the mechanical characteristic. Table 2 also shows the results. For the purpose of reference, Table 2 also shows the characteristics of a dense sintered body prepared from $Si_3N_4$ as those of "Ref 1", the characteristics of a porous body prepared from $Si_3N_4$ by the method disclosed in Japanese Patent Laying-Open No. 9-249457 as those of "Ref 2", and the characteristics of an $SiO_2$ porous as those of "Ref 3". As to each of reference examples "Ref 1" and "Ref 2", 5 mol % of $Y_2O_3$ was added as the sintering additive, while 3 wt. % of $Al_2O_3$ was introduced into the dense body of "Ref 1" in addition to $Y_2O_3$.

$SiO_3$ forming "Ref 3" was prepared by eluting a soluble phase from borosilicate glass while employing no additive.

TABLE 2

| No. | Type of Sintering additive | Total Porosity (%) | Closed Pore Ratio (%) | (r1 + r2)/b | tanδ (×10⁻⁵) | Flexural Strength (MPa) |
|---|---|---|---|---|---|---|
| 1* | $La_2O_3$ | 58 | 10 | 0.8 | 120 | 40 |
| 2* | $Nd_2O_3$ | 59 | 20 | 0.54 | 110 | 50 |
| 3 | $Sm_2O_3$ | 88 | 98 | 2.66 | 5 | 300 |
| 4 | $Er_2O_3$ | 80 | 92 | 2.43 | 12 | 250 |
| 5 | $Gd_2O_3$ | 65 | 65 | 1.81 | 70 | 190 |
| 6 | $Y_2O_3$ | 60 | 65 | 2.01 | 70 | 220 |
| 7 | $Yb_2O_3$ | 78 | 99 | 2.61 | 6 | 300 |
| 8* | $Al_2O_3$ | 28 | 2 | 0.3 | 320 | 60 |
| 9* | $Fe_2O3$ | 38 | <1 | 0.2 | 400 | 50 |
| Ref 1 | $Y_2O_3$ | 0 | 0 | 0 | 350 | |

TABLE 2-continued

| No. | Type of Sintering additive | Total Porosity (%) | Closed Pore Ratio (%) | (r1 + r2)/b | tanδ (×10⁻⁵) | Flexural Strength (MPa) |
|---|---|---|---|---|---|---|
| Ref 2 | $Y_2O_3$ | 52 | 8 | 0.9 | 600 | |
| Ref 3 | ... | 75 | 6 | 1.8 | 1000 | |

*comparative example

As understood from Table 2, each of the inventive sintered bodies obtained by adding the sintering additives exhibits porosity of at least 50%, i.e., relative density of not more than 50% and the ratio of closed pores of at least 50%. It is also understood that the inventive sintered body has superior electrical and mechanical characteristics to conventional porous ceramics with low dielectric loss of not more than $1 \times 10^{-4}$ and flexural strength of at least 150 MPa. Further, the inventive sintered body forms porous ceramics exhibiting the ratio (r1+r2)/b of at least 1 with holes having a diameter at least equivalent to that of the ceramic part depending on the sintering assistance. The diameter of holes was 0.7 μm in a sample No. 3, for example.

EXPERIMENTAL EXAMPLE 2

Three types of Si powder materials having mean grain sizes of 1, 10 and 15 μm respectively and $Sm_2O_3$ sintering additives of 0.8 μm in mean grain size were prepared. Each $Sm_2O_3$ sintering additive was prepared to be 1.0 mol % with respect to each Si powder. Each powder was prepared from a commercially available one. Each sample was subjected to mixing, molding, sintering and finishing similarly to Experimental Example 1. Table 3 shows results of the surface oxygen content of each Si powder, the total porosity, the closed pore ratio and the dielectric loss measured similarly to those in Experimental Example 1.

TABLE 3

| No. | Grain Size of Si Powder (μm) | Oxygen Content on Surface (mol %) | Total Porosity (%) | Closed Pore Ratio (%) | tanδ (×10⁻⁵) |
|---|---|---|---|---|---|
| 10 | 1 | 1.028 | 72 | 92 | 10 |
| 11 | 10 | 0.860 | 75 | 95 | 10 |
| 12 | 15 | 0.520 | 60 | 65 | 90 |

As understood from Table 3, the oxygen content (in terms of $SiO_2$) on the surface of the Si powder is reduced as the mean grain size of the powder is increased. It is also understood that the total porosity, the closed pore ratio and the dielectric loss vary with the mean grain size of the Si powder employed as the starting material.

EXPERIMENTAL EXAMPLE 3

Samples of Si powder having a mean grain size of 1 μm and sintering additives of $Yb_2O_3$ having a mean grain size of 0.8 μm were prepared. The sintering additives of $Yb_2O_3$ were prepared in ratios shown in Table 4 with respect to the Si powder. The oxygen content on the surface of the Si powder was set to 0.7 mol % in terms of $SiO_2$. Each powder was prepared from a commercially available one. The powder was subjected to mixing, molding, sintering and finishing similarly to Experimental Example 1. Table 4 shows results of the total porosity, the closed pore ratio and the dielectric loss of each sintered body measured similarly to those in Experimental Example 1.

TABLE 4

| No. | Content of Sintering additive (mol %) | Total Porosity (%) | Closed Pore Ratio (%) | tanδ (× 10⁻⁵) |
|---|---|---|---|---|
| 13* | 0.08 | 65 | 30 | 100 |
| 14 | 0.39 | 67 | 98 | 10 |
| 15 | 1.5 | 50 | 85 | 40 |
| 16* | 2.6 | 42 | 45 | 220 |

*comparative example

As understood from Table 4, the total porosity reaches 65%, i.e., the relative density reaches 35% less than 50% when the content of the sintering additive is less than 0.2 mol %, while the ratio of the closed pores is at a low value of 30% to indicate insufficient hollowing of Si grains in the sintering step. When the content of the sintering additive exceeds 2.5 mol %, the total porosity reaches 42%, i.e., the relative density reaches 58% less than 70%, while the ratio of the closed pores is at a low value of 45% to indicate that the ratio of closed pores was reduced due to grain growth.

EXPERIMENTAL EXAMPLE 4

Samples of Si powder having a mean grain size of 1 μm and a sintering additive of $Er_2O_3$ having a mean grain size of 0.8 μm were prepared. The sintering additive of $Er_2O_3$ was prepared to be 0.6 mol % with respect to the Si powder. The oxygen contents on the surfaces of the Si powder samples were set as described in Table 5 in terms of $SiO_2$. Each powder was subjected to mixing, molding, sintering and finishing similarly to Experimental Example 1. Table 5 shows results of the total porosity, the closed pore ratio and the dielectric loss of each sintered body measured similarly to those in Experimental Example 1.

TABLE 5

| No. | Oxygen Content on Surface (mol %) | Total Porosity (%) | Closed Pore Ratio (%) | tanδ (× 10⁻⁵) |
|---|---|---|---|---|
| 17* | 0.174 | 67 | 48 | 90 |
| 18 | 0.434 | 65 | 80 | 40 |
| 19 | 0.860 | 70 | 90 | 20 |
| 20* | 1.691 | 50 | 35 | 220 |
| 21* | 3.271 | 40 | 5 | 250 |

*comparative example

As understood from Table 5, the characteristics of the obtained sintered bodies vary with the oxygen contents on the Si powder materials employed as the starting materials. When the oxygen content on the surface of the Si powder is less than 0.4 mol % in terms of $SiO_2$, the total porosity reaches 67%, i.e., the relative density reaches 33% less than 50%, while the ratio of the closed pores is at a small value of 48% to indicate that Si grains are insufficiently hollowed. When the oxygen content on the surface of the Si powder exceeds 1.5 mol %, the ratio of the closed pores is less than 50% to indicate that the hollowed structure was changed due to grain growth.

EXPERIMENTAL EXAMPLE 5

Samples of Si powder having a mean grain size of 1 μm and a sintering additive of $Er_2O_3$ having a mean grain size of 0.8 μm were prepared. The sintering additive of $Er_2O_3$ was prepared to be 0.8 mol % with respect to the Si powder. The oxygen content on the surface of the Si powder was set to 0.7 mol % in terms of $SiO_2$. Each powder was subjected to mixing and molding similarly to Experimental Example 1. Each green compact was sintered under conditions shown in Table 6 in a nitrogen atmosphere of the atmospheric pressure by microwave heating of 28 GHz. Referring to Table 6, "1150×6" indicates that the green compact was held at 1150° C. for 6 hours, and "1200×3+1400×3" indicates that the green compact was held at 1200° C. for 3 hours and thereafter heated to 1400° C. and held at this temperature for 3 hours. This also applies to the remaining samples.

Each sintered body was finished similarly to Experimental Example 1. Table 6 also shows the results of the total porosity, the closed pore ratio, the value (r1+r2)/b and the dielectric loss of each sintered body measured similarly to those in Experimental Example 1. The value (r1+r2)/b is shown as the average of values measured on 50 portions.

TABLE 6

| No. | Sintering Condition | Total Porosity (%) | Closed Pore Ratio (%) | (r1 + r2)/b | tanδ (×10⁻⁵) |
|---|---|---|---|---|---|
| 22* | 1150 × 6 | 78 | 28 | 0.50 | 120 |
| 23 | 1200 × 3 + 1400 × 3 | 80 | 92 | 2.43 | 12 |
| 24 | 1300 × 3 + 1500 × 3 | 80 | 90 | 2.40 | 7 |
| 25 | 1300 × 3 + 1700 × 3 | 79 | 88 | 2.01 | 9 |
| 26* | 1300 × 3 + 1800 × 3 | 29 | 35 | 0.80 | 100 |

*comparative example

As understood from Table 6, Si grains are insufficiently hollowed when the sintering temperature is less than 1200° C. and the sintering time is about 6 hours. Therefore, it is understood that the ratio of the closed pores is at a low value of 28%, the value (r1+r2)/b is 0.5, i.e., the diameter of holes is half that of the ceramic part, and the dielectric loss is at a high value of $120\times 10^{-5}$. It is also understood that the hollowed structure is changed and densified due to grain growth and phase transformation when the sintering temperature is 1800° C. It is further understood that the value (r1+r2)/b is at least 2 and the dielectric loss is not more than $12\times 10^{-5}$ when the sintering temperature is 1200° C. to 1750° C.

EXPERIMENTAL EXAMPLE 6

Samples of Si powder and $Er_2O_3$ powder were prepared similarly to Experimental Example 5. The samples were subjected to mixing and molding similarly to Experimental Example 1. The obtained green compacts were sintered under a nitrogen atmosphere of the atmospheric pressure by carbon heating under conditions shown in Table 7. Referring to Table 7, the sintering conditions are notated similarly to those in Experimental Example 5. The obtained sintered bodies were finished similarly to Experimental Example 1. Table 7 also shows the total porosity, the closed pore ratio, the value (r1+r2)/b and the dielectric loss of each sintered body measured similarly to those in Experimental Example 1. The value (r1+r2)/b is shown as the average of values measured on 50 portions.

TABLE 7

| No. | Sintering Condition | Total Porosity (%) | Closed Pore Ratio (%) | (r1 + r2)/b | tanδ (×10⁻⁵) |
|---|---|---|---|---|---|
| 27* | 1150 × 6 | 55 | 25 | 0.27 | 200 |
| 28 | 1300 × 3 + 1500 × 3 | 50 | 65 | 2.01 | 100 |
| 29 | 1200 × 3 + 1400 × 3 | 55 | 70 | 2.50 | 80 |
| 30* | 1300 × 3 + 1800 × 3 | 20 | 30 | 0.54 | 160 |

*comparative example

As understood from Table 7, Si grains are insufficiently hollowed when the sintering temperature is less than 1200° C. and the sintering time is about 6 hours. It is also understood that the hollowed structure is changed and densified due to grain growth and phase transformation when the sintering temperature is 1800° C. Comparing Tables 6 and 7 with each other, it is understood that the ratio of closed pores is increased and the dielectric loss is reduced when microwave heating is employed. This is conceivably because the microwave attains more efficient heating to prompt diffusion of silicon into the shell.

EXPERIMENTAL EXAMPLE 7

Samples of Al powder having a mean grain size of 5 μm and sintering additives of $Y_2O_3$ and MgO having mean grain sizes of 0.8 μm and 0.5 μm respectively were prepared. The sintering additives of $Y_2O_3$ and MgO were prepared to have ratios shown in Table 8 with respect to the Al powder. Each powder was prepared from a commercially available one. Table 8 also shows the oxygen contents on the surfaces of the Al powder materials, measured by the method in Experimental Example 1 in terms of $Al_2O_3$. Each powder and each sintering additive were mixed with each other in a ball mill for 24 hours with a solvent of ethyl alcohol. Thereafter the mixture was naturally dried and molded into φ23×3 mm and 4.5 by 7 by 45 mm by dry pressing. The obtained green compact was held at 900° C. for 3 hours in a nitrogen atmosphere of the atmospheric pressure by microwave heating at a frequency of 28 GHz, thereafter heated to 1250° C. and held at this temperature for 3 hours. It was confirmed by X-ray diffraction that the obtained sintered body entirely consisted of AMN with no residual metallic Al. The sintered body was finished similarly to Experimental Example 1. Table 8 also shows the total porosity, the closed pore ratio, the value (r1+r2)/b and the dielectric loss of each sintered body measured similarly to Experimental Example 1. The value (r1+r2)/b is shown as the average of values measured on 50 portions.

TABLE 8

| No. | Oxygen Content (mol %) | $Y_2O_3$ (mol %) | MgO (mol %) | Total Porosity (%) | Closed Pore Ratio (%) | (r1 + r2)/b | tanδ (×10⁻⁵) |
|---|---|---|---|---|---|---|---|
| 31* | 0.5 | 0.05 | 0.2 | 70 | 20 | 0.6 | 110 |
| 32 | 0.7 | 0.2 | 0.6 | 60 | 70 | 2.1 | 40 |
| 33* | 1.6 | 0.3 | 1.6 | 30 | 15 | 0.4 | 150 |

*comparative example

As understood from Table 8, the sample No. 32 of the AlN porous ceramics according to the present invention exhibits total porosity of 60%, i.e., relative density of 40% less than 70% and a ratio of closed pores of 70% exceeding 50%. This excellent porous ceramics also shows low dielectric loss.

EXPERIMENTAL EXAMPLE 8

Samples of Al powder having a mean grain size of 5 μm and sintering additives of $Sm_2O_3$ and $Li_2O$ having mean grain sizes of 0.8 µm and 0.5 µm respectively were prepared. The sintering additives of $Sm_2O_3$ and $Li_2O$ were prepared to have ratios shown in Table 9 with respect to the Al powder. Each powder was prepared from a commercially available one. Each powder and each sintering additive were mixed with each other in a ball for 24 hours with a solvent of ethyl alcohol. Thereafter the mixture was naturally dried and molded into φ23×3 mm and 4.5 by 7 by 45 mm by dry pressing. The obtained green compact was held at 800° C. for 3 hours in a nitrogen atmosphere of the atmospheric pressure by microwave heating at a frequency of 28 GHz, thereafter heated to 1200° C. and held at this temperature for 3 hours. It was confirmed by X-ray diffraction that the obtained sintered body entirely consisted of $Al_2O_3$ with no residual metallic Al. The sintered body was finished similarly to Experimental Example 1. Table 9 also shows the total porosity, the closed pore ratio, the value (r1+r2)/b and the dielectric loss of each sintered body measured similarly to Experimental Example 1. The value (r1+r2)/b is shown as the average of values measured on 50 portions.

TABLE 9

| No. | $Sm_2O_3$ (mol %) | $Li_2O$ (mol %) | Total Porosity (%) | Closed Pore Ratio (%) | (r1 + r2)/b | tanδ (×10$^{-5}$) |
|---|---|---|---|---|---|---|
| 34* | 0.01 | 0.2 | 52 | 30 | 0.2 | 105 |
| 35 | 0.2 | 0.5 | 55 | 60 | 2.05 | 12 |
| 36* | 0.09 | 1.6 | 20 | 12 | 0.4 | 110 |

*comparative example

As understood from Table 9, the sample No. 35 of the $Al_2O_3$ porous ceramics according to the present invention exhibits total porosity of 55%, a ratio of closed pores of 60% and low dielectric loss.

According to this embodiment, as hereinabove described, porous ceramics having a higher ratio of closed pores as compared with other materials and conventional methods can be obtained with homogeneously dispersed closed pores. The porous ceramics according to this embodiment, having the high ratio of closed pores and excellent electrical and mechanical characteristics, exhibits excellent characteristics when applied to an electronic circuit board or the like requiring moisture absorption resistance, low permittivity and low dielectric loss as well as mechanical strength.

(Second Embodiment)

The present invention has been proposed on the basis of the recognition that porous ceramics having porosity of at least 30%, preferably at least 50%, and surface roughness (Ra) of less than 0.5 µm, preferably less than 0.2 µm and more preferably less than 0.1 µm, can exhibit functions suitable to various types of structural materials and electronic materials.

A porous ceramic matrix according to the present invention can be prepared by a known method with employment of alumina, silica, silicon nitride, aluminum nitride or silicon carbide. In order to apply the inventive porous ceramics to a structural material or an electronic material, silicon nitride, aluminum nitride or silicon carbide is preferably selected in consideration of mechanical strength and heat conductivity, and the porous ceramics preferably contains at least 50 vol. % of at least one of these materials. When the porous ceramics is applied to an electronic component requiring weather resistance (humidity resistance), the porous body preferably consists of closed pores, and surface roughness can also be further reduced.

In order to attain sufficient surface smoothness by a method suitable for production without causing warpage or internal stress while keeping high dimensional accuracy, the following working method can be employed:

A solid material causing solid phase reaction with the porous matrix of ceramics is selected as abrasive grains or an abrasive, for smoothing the porous surface by working and polishing the same (applying mechanical energy).

When working silicon nitride porous ceramics having porosity of 50%, for example, porous ceramics having a flattened surface can be obtained by employing polishing abrasive grains including $\gamma Al_2O_3$ grains and $SiO_2$ grains dispersed in water.

In order to obtain a smooth porous body surface, conditions of abrasive grains, a polishing solution and a polishing speed (contact pressure) must be properly selected and controlled. The grain size of the abrasive grains is preferably not more than 0.1 µm, and the pH of an aqueous solution sharing the abrasive grains is adjusted to at least 7.

The pH of the aqueous solution is adjusted to at least 7 for the following reason: Formation of a hydroxyl group such as Si—OH remarkably contributes to this solid phase reaction or surface smoothing and can improve working efficiency (or surface smoothness). While this is not impossible also when the pH is less than 7, long-term working may be required or surface smoothness may be hard to obtain in this case.

In general, the abrasive grains are selected from a group consisting of materials causing solid phase reaction with a composition of porous ceramics or an oxide thereof.

While the details of the mechanism are not necessarily clear, flattening of the surface progresses not only by simple mechanical energy but also by oxidation, dissolution/redeposition and solid phase diffusion in the following process:

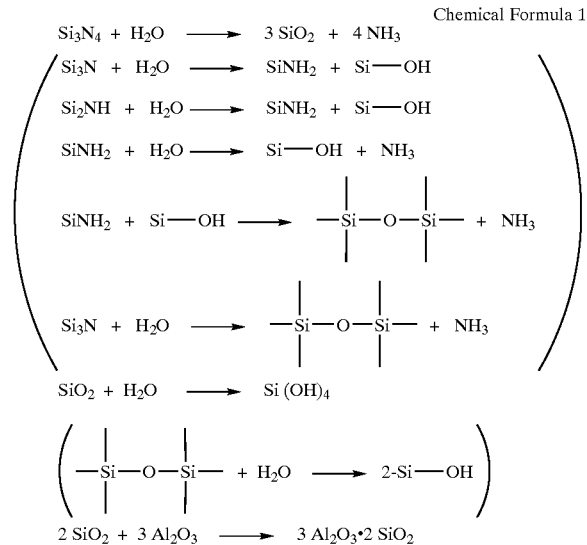

Chemical Formula 1

Figure 5:
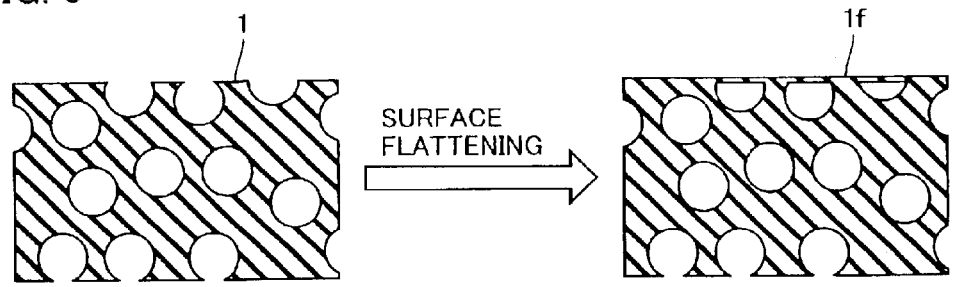
FIG. 5 is a sectional view schematically showing a step of obtaining surface-smoothed porous ceramics.

Referring to FIG. 5, surface roughness (Ra) of a surface if of obtained $Si_3N_4$ porous ceramics 1 is less than 0.5 µm, preferably less than 0.2 µm, and more preferably less than 0.1 µm, depending on polishing conditions. Al is dispersed in the surface layer part of the ceramics 1 so that the concentration thereof is inclined along the thickness to provide a composite phase (composite phase consisting of a ceramic composition resulting from solid phase reaction and the abrasive grain composition) of Al, Si, O and N in a structure continuous from the inner part of the matrix to the surface region of the ceramics 1. In the embodiment shown in FIG. 5, the surface is formed by closed pores.

The aforementioned solid state diffusion or the like can be caused to cover the pores on the surface, or arbitrary pores can be left on the surface. The depth of the surface region having a different composition ratio is preferably less than 10 μm, more preferably less than 5 μm from the surface. If the depth exceeds this range, the characteristics intrinsic to the ceramic porous body may be damaged.

The porous ceramics according to the present invention is characterized in that the porosity is at least 30%, more preferably at least 50%, the surface roughness is less than 0.5 μm, preferably less than 0.2 μm, and more preferably less than 0.1 μm.

Also when the pore size is at least 0.1 μm or at least 1 μm, the porous ceramics can be applied in a wider range due to the aforementioned flatness.

The surface region (in the depth of within 10 μm from the surface) may contain at least one element not contained in the porous ceramics, or the composition ratios of the surface region and the inner part may be different from each other. A thin film of a metal, an oxide or a nitride or a patterned metallic conductor can be formed on the surface of such surface-flattened porous ceramics, and the surface roughness is shown by the roughness on the interface between the surface film and the porous ceramics in this case.

Experimental Examples related to this embodiment are now described.

EXPERIMENTAL EXAMPLE 9

Samples of porous bodies were prepared as shown in Table 10, and subjected to surface working under prescribed conditions.

Referring to Tables 10, samples Nos. 41 to 48 and 50 to 53 have open pores, and samples Nos. 54 to 57 have closed pores.

The porous ceramics samples Nos. 41 to 48 and 50 to 53 were granulated, molded and sintered by known methods. Table 10 also shows the values of porosity of the respective samples. The pore sizes are 0.5 to 5 Am. Abrasive grains described in Table 10 were dispersed in water at the rate of 5 vol. % and the pH values of formed aqueous solutions were adjusted as shown in Table 10, for executing surface working. In surface regions of the samples Nos. 43 to 45, 56 and 57, Al was present in ratios of 2:3 to 8:2 (Si:Al) to Si in the range of depth of 3 μm from the surfaces, and formation of $3Al_2O_3 \cdot 2SiO_2$ (mullite) was also confirmed.

Fluctuation of compositions was hardly confirmed in comparative samples Nos. 50 to 53. Diamond abrasive grains cause no solid phase reaction (or only ignorable solid phase reaction) with the matrices, and hence the surfaces of the porous matrices employed in these comparative samples were not smoothed but remained irregular similarly to conventional abrading employing only mechanical action.

The ceramics may alternatively be prepared from alumina, silica, aluminum nitride or silicon carbide. In this case, it is preferable to employ abrasive grains prepared from a combination of $Si_3N_4$ and $SiO_2$ for alumina, $Al_2O_3$, $Si_3N_4$ and $SiO_2$ for silica, $Si_3N_4$, $Al_2O_3$ and $SiO_2$ for aluminum nitride or $Al_2O_3$, $Si_3N_4$ and $SiO_2$ for silicon carbide, as shown in Table 11.

TABLE 10

| Sample Number | Ceramics | Sintering additive | Porosity | Closed Pore Ratio | Abrasive Grains | Abrasive Grain Ratio | PH | Surface Roughness |
|---|---|---|---|---|---|---|---|---|
| 41 (comparative example) | silicon nitride | $Y_2O_3$(5 wt %) | 0 | — | $Al_2O_3$, $SiO_2$ | 8:2 | 8 | 0.07 |
| 42 (comparative example) | silicon nitride | $Y_2O_3$(5 wt %) | 15 | 20 | $Al_2O_3$, $SiO_2$ | 8:2 | 8 | 0.08 |
| 43 (inventive example) | silicon nitride | $Y_2O_3$(5 wt %) | 30 | 2 | $Al_2O_3$, $SiO_2$ | 8:2 | 8 | 0.1 |
| 44 (inventive example) | silicon nitride | $Y_2O_3$(5 wt %) | 50 | <1 | $Al_2O_3$, $SiO_2$ | 8:2 | 8 | 0.15 |
| 45 (inventive example) | silicon nitride | $Y_2O_3$(5 wt %) | 70 | <1 | $Al_2O_3$, $SiO_2$ | 8:2 | 8 | 0.3 |
| 46 (inventive example) | silicon nitride | $Y_2O_3$(5 wt %) | 50 | <1 | $Al_2O_3$, $SiO_2$ | 8:2 | 4 | 1 |
| 47 (inventive example) | silicon nitride | $Y_2O_3$(5 wt %) | 50 | <1 | $Al_2O_3$, $SiO_2$ | 8:2 | 6 | 0.48 |
| 48 (inventive example) | silicon nitride | $Y_2O_3$(5 wt %) | 50 | <1 | $Al_2O_3$, $SiO_2$ | 8:2 | 7 | 0.4 |
| 50 (comparative example) | silicon nitride | $Y_2O_3$(5 wt %) | 0 | — | diamond | — | 8 | 0.03 |
| 51 (comparative example) | silicon nitride | $Y_2O_3$(5 wt %) | 15 | 20 | diamond | — | 8 | 0.5 |
| 52 (comparative example) | silicon nitride | $Y_2O_3$(5 wt %) | 30 | 2 | diamond | — | 8 | 1.5 |
| 53 (comparative example) | silicon nitride | $Y_2O_3$(5 wt %) | 50 | <1 | diamond | — | 8 | 3.2 |
| 54 (comparative example) | silicon nitride | $Er_2O_3$(10 wt %) | 0 | — | $Al_2O_3$, $SiO_2$ | 8:2 | 8 | 0.03 |
| 55 (comparative example) | silicon nitride | $Er_2O_3$(10 wt %) | 18 | 40 | $Al_2O_3$, $SiO_2$ | 8:2 | 8 | 0.03 |
| 56 (inventive example) | silicon nitride | $Er2O_3$(10 wt %) | 31 | 70 | $Al_2O_3$, $SiO_2$ | 8:2 | 8 | 0.04 |
| 57 (inventive example) | silicon nitride | $Er_2O_3$(10 wt %) | 75 | 88 | $Al_2O_3$, $SiO_2$ | 8:2 | 8 | 0.04 |

TABLE 11

| Sample Number | Ceramics | Sintering additive | Porosity | Closed Pore Ratio | Abrasive Grains | Abrasive Grain Ratio | PH | Surface Roughness |
|---|---|---|---|---|---|---|---|---|
| 58 (inventive example) | alumina | — | 50 | — | $Si_3N_4$, $SiO_2$ | 8:2 | 8 | 0.08 |
| 59 (inventive example) | silica | — | 50 | — | $Al_2O_3$, $Si_3N_4$, $SiO_2$ | 5:3:2 | 8 | 0.12 |
| 60 (inventive example) | aluminum nitride | $Y_2O_3$ | 50 | — | $Si_3N_4$, $Al_2O_3$, $SiO_2$ | 5:3:2 | 8 | 0.2 |
| 61 (inventive example) | silicon carbide | — | 50 | — | $Al_2O_3$, $Si_3N_4$, $SiO_2$ | 5:3:2 | 8 | 0.4 |

According to this combination, the surface roughness (Ra) can be set to less than 0.5 μm, as shown in Table 11. A region containing Si was confirmed in the range of 5 μm from the surface in each of samples Nos. 58 and 60, while a region containing Al was confirmed in the range of 5 μm from the surface in each of samples Nos. 59 and 61.

Each of samples Nos. 54 to 57 according to Experimental Example 9 and samples according to Experimental Example 10 described later was prepared as follows:

Si powder of 1 μm in mean grain size and a sintering additive of $Er_2O_3$ having a mean grain size of 0.8 μm shown in Table 10 were prepared. The sintering additive of $Er_2O_3$ was prepared to be 10 wt. % with respect to the Si powder. Each powder was prepared from a commercially available one. The oxygen content on the surface of the Si powder was previously confirmed as 0.7 mol % in terms of $SiO_2$ through measurement by inert gas fusion and infrared detection. The Si powder and the sintering additive were mixed with each other in a ball mill for 24 hours with a solvent of ethyl alcohol. The obtained mixture was naturally dried and molded into φ23×3 mm by dry pressing. This green compact was held at 1300° C. for 3 hours in a-nitrogen atmosphere of the atmospheric pressure by microwave heating at a frequency of 28 GHz, thereafter heated to 1600° C. and held at this temperature for 3 hours. Thus, a sintered body having porosity of 75% was obtained.

Heat treatment conditions were varied as follows, for adjusting the porosity:

1300° C. for 30 hours+1900° C. for 3 hours (porosity: 0%)
1300° C. for 3 hours+1800° C. for 30 hours (porosity: 18%)
1300° C. for 3 hours+1650° C. for 30 hours (porosity: 31%)

Apparent density was calculated from the size and the weight of the sintered body while calculating theoretic density from the amount of the sintering additive according to the law of mixture, for obtaining the total porosity as follows:

(1−apparent density/theoretical density)×100 (%)

The volume of closed pores was measured with a mercury porosimeter for calculating the closed pore ratio as follows:

(total pore volume−closed pore volume)/total pore volume×100 (%)

EXPERIMENTAL EXAMPLE 10

Transmission loss of a signal on a surface transmission path was measured as an exemplary characteristic of surface-smoothed porous ceramics.

Each of samples Nos. 54 to 57, having closed pores, shown in Table 10 was finished to be 5 mm by 2 mm by 0.25 mm$^t$ and the substrate surface was metallized with Au by mask deposition, thereby forming a microstrip line. The line width of the microstrip line was set to 0.9 mm. A covar plate of 5 mm by 2 mm by 0.1 mm$^t$ was cut and plated with Au with a thickness of 2 μm on its surface for preparing a base layer, which in turn was brazed to the back surface of the substrate for forming a microstrip substrate. Table 12 shows the results.

TABLE 12

| Sample Number | Ceramics | Sintering additive | Porosity | Closed Pore Ratio | Abrasive Grains | Abrasive Grain Ratio | PH | Surface Roughness | Transmission Loss |
|---|---|---|---|---|---|---|---|---|---|
| 62 (comparative example) | silicon nitride | $Er_2O_3$(10 wt %) | 75 | 88 | diamond | — | — | 3.6 | 12 |
| 63 (comparative example) | silicon nitride | $Er_2O_3$(10 wt %) | 75 | 88 | diamond | — | — | 1.6 | 6 |
| 64 (comparative example) | silicon nitride | $Er_2O_3$(10 wt %) | 75 | 88 | $Al_2O_3$, $SiO_2$ | 8:2 | 4 | 0.6 | 3 |
| 65 (comparative example) | silicon nitride | $Er_2O_3$(10 wt %) | 0 | — | $Al_2O_3$, $SiO_2$ | 8:2 | 8 | 0.03 | 1.2 |
| 66 (comparative example) | silicon nitride | $Er_2O_3$(10 wt %) | 18 | 40 | $Al_2O_3$, $SiO_2$ | 8:2 | 8 | 0.03 | 2.1 |
| 67 (inventive example) | silicon nitride | $Er_2O_3$(10 wt %) | 31 | 70 | $Al_2O_3$, $SiO_2$ | 8:2 | 8 | 0.04 | 0.5 |
| 68 (inventive example) | silicon nitride | $Er_2O_3$(10 wt %) | 75 | 88 | $Al_2O_3$, $SiO_2$ | 8:2 | 8 | 0.04 | 0.3 |

According to this embodiment, as hereinabove described, porous ceramics having a smooth surface is effectively obtained.

(Third Embodiment)

Figure 6:
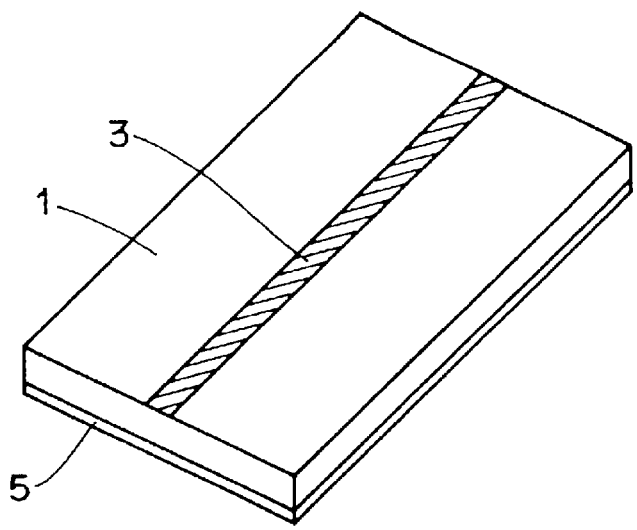
FIG. 6 is a perspective view showing a first structure of a microstrip substrate according to the present invention.
Figure 7:
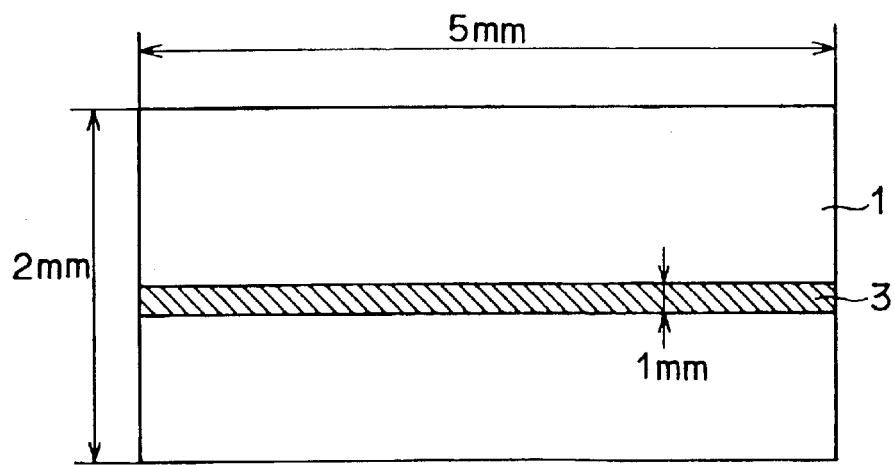
FIG. 7 is a plan view showing the first structure of the microstrip substrate according to the present invention.
Figure 8:
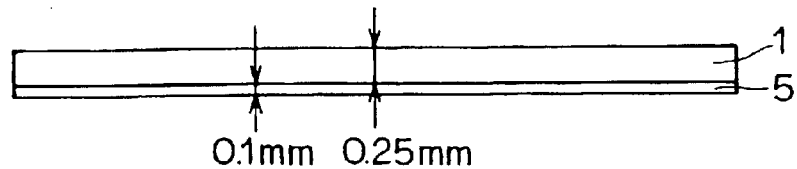
FIG. 8 is a side elevational view showing the first structure of the microstrip substrate according to the present invention.

Referring to FIGS. 6 to 8, a microstrip substrate according to a third embodiment of the present invention has a substrate 1, a microstrip line 3 and a base layer 5. The microstrip line 3 is linearly formed on the surface of the substrate 1. The base layer 5 is formed on the overall back surface of the substrate 1.

The substrate 1 consists of a porous ceramic body, and consists of ceramics containing aluminum oxide, silicon nitride and/or aluminum nitride as a single element or in an arbitrary combination, for example. The microstrip line 3 is metallized with gold (Au), for example, and the base layer 5 consists of a covar plate, for example.

The longitudinal size of the substrate 1 is 5 mm, the latitudinal size is 2 mm, for example, and the thickness is 0.25 mm, for example. The line width of the microstrip line 3 is 1 mm, for example, and the thickness of the base layer 5 is 0.1 mm, for example.

The porous ceramics forming the substrate 1 has hollow parts 1a defining closed pores as schematically shown in FIG. 1, and hence a dense part (skeletal part) 1 has a continuous network structure. The porous substrate 1 has porosity of at least 30%, and the ratio of closed pores among all pores is at least 50%. In this substrate 1, the porosity is preferably at least 50%, and the ratio of closed pores among all pores is preferably at least 80%, more preferably at least 90%. In an arbitrary section of the ceramic porous body shown in FIG. 1, the radii r1 and r2 of a pair of adjacent holes 1a and the width b of the ceramic part (dense part) preferably satisfy the relation (r1+r2)/b>1.

Figure 2:
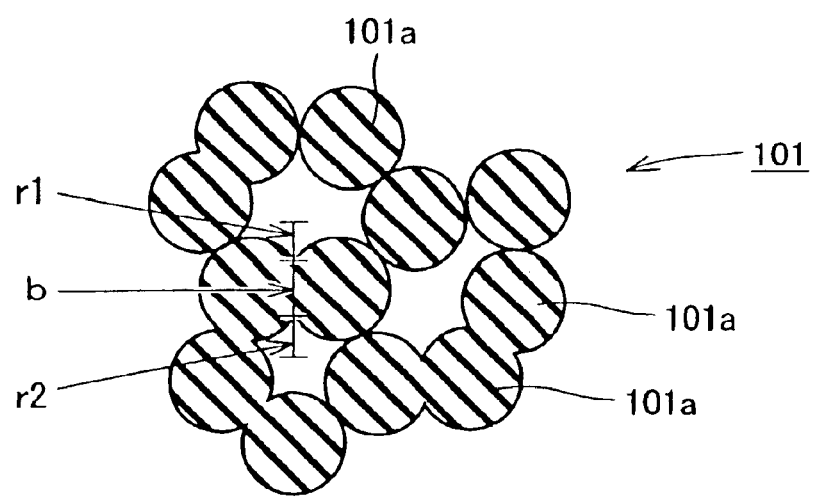
FIG. 2 is a model diagram of the sectional structure of conventional porous ceramics.
Figure 3A:
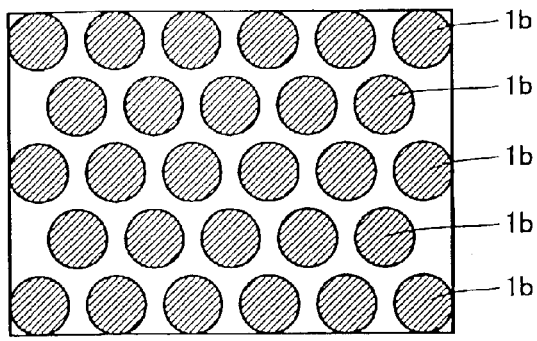
FIGS. 3A to 3C are sectional views showing a sintering process for the porous ceramics according to the present invention, with FIG. 3A showing a molded state, FIG. 3B showing a state in an initial stage of sintering, and FIG. 3C showing a completely sintered state.
Figure 3B:
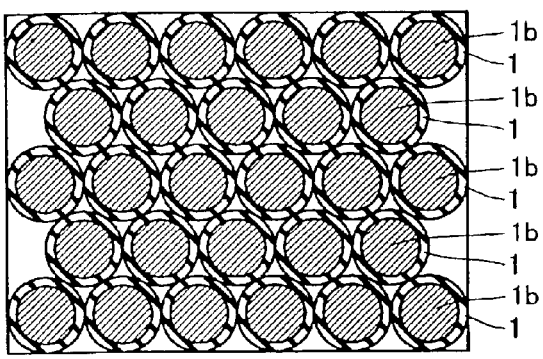
Figure 3C:
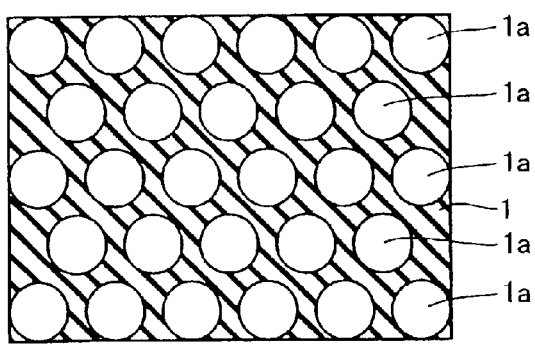
Figures 4A, 4B, 4C, 4D:
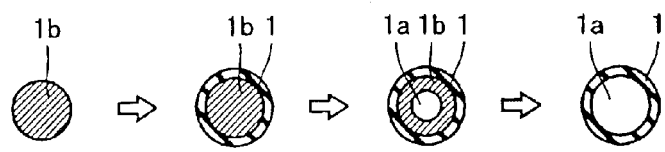
FIGS. 4A to 4D are sectional views schematically illustrating change of a single metallic grain in the sintering process for the porous ceramics according to the present invention, with FIG. 4A showing an unsintered state, FIG. 4B showing an initially sintered state, FIG. 4C showing an intermediately sintered state, and FIG. 4D showing a completely sintered state.

As shown in FIG. 2, a plurality of grains 101a are bonded to each other while defining pores between these grains 101a to provide a structure of open pores in porous ceramics employed for a conventional substrate 1, dissimilarly to the structure of closed pores according to this embodiment.

A method of manufacturing the microstrip substrate according to this embodiment is now described in detail.

The porous ceramics forming the substrate 1 employed for the microstrip substrate according to this embodiment is prepared as follows:

The porous ceramics forming the substrate 1 is obtained by a method including steps of preparing metallic powder and sintering additive powder, mixing the metallic powder and the sintering additive powder with each other into mixed powder, molding the mixed powder into a green compact and sintering the green compact under an atmosphere containing nitrogen or oxygen into a sintered body of a metal nitride or a metal oxide.

Closed pores are obtained by hollowing the metallic powder employed as the precursor for the ceramics. The relative density and the ratio of the closed pores among all pores can be controlled by the grain size of the metallic powder employed as the starting material. The metallic powder can be prepared from commercially available high-purity metallic powder. However, a natural oxide film or a thermal oxide film resulting from subsequent heat treatment is formed on the surface of the metallic powder. The degree of hollowing remarkably varies with the quantity of the oxide film in ceramics other than oxide ceramics, and hence it is important to control the oxygen content in the metallic powder. The oxygen content is preferably selected in the range of at least 0.4 mol % and not more than 1.5 mol % in terms of the metal oxide.

The mean grain size of the metallic powder is preferably at least 0.1 μm and not more than 15 μm. It is difficult to control the said oxygen content due to a large specific surface area if the mean grain size is less than 0.1 μm, while the reaction time for completely hollowing the metallic powder is uneconomically increased if the mean grain size exceeds 15 μm.

A rare earth oxide is added to the said metallic powder as the sintering additive. As to the rare earth oxide, at least one material selected from $Yb_2O_3$, $Sm_2O_3$, $Er_2O_3$, $Gd_2O_3$ and $Y_2O_3$ is preferably added to the metallic powder by at least 0.2 mol % and not more than 2.5 mol %. If the content of the rare earth oxide is less than 0.2 mol %, diffusion of the metal is not prompted and hollowing is insufficiently performed. If the content exceeds 2.5 mol %, the total porosity is readily reduced. $Fe_2O_3$ or $Al_2O_3$ generally known as the sintering additive for ceramics is unpreferable for this embodiment due to insufficient hollowing.

The mean grain size of the added sintering additive is preferably at least 0.1 μm and not more than 1 μm. The ceramics is hard to handle since aggregation or the like is readily caused if the mean grain size is less than 0.1 μm, while nitriding or oxidation of the metallic powder hardly progresses if the mean grain size exceeds 1 μm. When the oxide film on the surface of the metallic powder hinders the reaction, an alkaline metal, an alkaline earth metal or an oxide of such a metal is preferably added as a second sintering additive in addition to the aforementioned sintering additive. The content of the second sintering additive is preferably at least 0.1 mol % and not more than 1.5 mol %, and the mean grain size thereof is preferably at least 0.1 μm and not more than 2 μm.

The metallic powder and the sintering additive as well as an organic binder added at need are mixed with each other by an existing method such as ball milling or ultrasonic mixing, and dried after the mixing. Thereafter the mixture is molded into a prescribed shape, to obtain a green compact. A well-known method such as general dry press molding, extrusion molding, doctor blade molding or injection molding can be employed for this molding, and a method most desirable in view of quality and production can be selected in response to the desired shape. The mixed powder may also be granulated into granules in advance of the molding, to be previously increased in bulk density and improved in moldability. The said organic binder is added in a case of further improving the moldability.

The said green compact is heat-treated in atmospheric gas containing nitrogen or oxygen thereby progressing nitriding or oxidation of the metal, so that the individual metallic grains are hollowed, nitrides or oxides of the reacting adjacent metallic grains are integrated with each other and porous ceramics having fine closed pores can be obtained.

Referring to FIGS. 3A to 3C and 4A to 4D, the surfaces of metallic grains 1b are first nitrided or oxidized, and nitride or oxide films 1 are formed on the outer peripheries of the metallic grains 1b. When the heat treatment is progressed, the metal diffuses toward the nitrides or oxides 1 formed on the outer peripheries for progressing nitriding or oxidation. Thus, holes 1a are defined in the metallic grains 1b due to the diffusion of the metal toward the outer peripheries, and the metallic grains 1b are hollowed. Finally, most parts of the metallic grains 1b are converted to the holes 1a forming closed pores. Thus, a plurality of holes 1a are formed as closed pores, so that the dense part 1 of the ceramics consisting of a nitride or an oxide has a continuous network structure.

The degree of hollowing varies with the oxygen content in the metallic powder employed as the starting material, the type of the sintering additive or the heat treatment method. The size of the individual closed pores basically depends on the grain size of the metallic powder employed as the starting material, and hence the size of the closed pores is uniform when the grain size of the metallic powder is uniform, so that the ceramics contains no coarse closed pores.

The heat treatment can be carried out in a carbon heater furnace or the like. Heat treatment employing a microwave is preferable for prompting diffusion of the metallic powder and suppressing disappearance of a hollow structure resulting from grain growth. Particularly when the mixed powder is irradiated and heated with a microwave having a frequency of at least 20 GHz, diffusion of the metal into the metal nitride or the metal oxide formed on the shell of the metallic powder can be further prompted, whereby the metallic powder can be preferably readily hollowed.

The preferable temperature range for the heat treatment temperature varies with the metallic powder employed as the starting material, and hence a case of obtaining porous ceramics of $Si_3N_4$ by nitriding Si is now described.

The heat treatment temperature for nitriding Si is preferably at least 1200° C. If the heat treatment temperature is less than 1200° C., progress of nitriding of the metallic powder is uneconomically retarded. A temperature of not more than 1500° C. is preferable for heating with a carbon heater, and a temperature of not more than 1750° C. is preferable for microwave heating. A higher temperature results in phase transformation of the metal nitride or grain growth, and hence the hollowed structure is so changed that it is difficult to obtain the porous ceramics according to this embodiment.

The temperature is preferably increased to the maximum level stepwise in at least two stages. This is because nitriding of the metal is exoergic reaction, and hence the temperature exceeds the melting point of the metal due to exothermic heat to melt the metal if the metal is heated to the final sintering temperature at once. The melted metal forms an unreacted melted block to result in coarse holes or elution from the green compact, disadvantageously leading to deterioration of mechanical and electrical characteristics of the porous ceramics. Also when another metallic powder is employed as the starting material or oxidized, the temperature is preferably increased stepwise in at least two stages, although temperature conditions are different.

The heat treatment is performed in a non-oxidizing atmosphere containing $N_2$ or $NH_3$, in order to obtain a nitride. Alternatively, an oxidizing atmosphere containing $O_2$ is employed in order to obtain an oxide. In either case, the pressure is not restricted but preferably set to at least 1 atom (101 kPa) and not more than 5 atoms (507 kPa).

In the porous ceramics forming the substrate 1 according to this embodiment obtained in the aforementioned manner, individual grains of the metallic powder are hollowed to provide a structure where holes of a uniform diameter are dispersed, so that the porous ceramics substantially consists of a single inorganic ceramic layer. Therefore, the substrate 1 can be prepared from porous ceramics having excellent moisture absorption resistance, low permittivity and low dielectric loss.

In this porous ceramics, the porosity can be set to at least 30%, and the ratio of closed pores among all pores can be set to at least 50%. Further, the porosity can be set to at least 50% and the ratio of the closed pores among all pores can be set to at least 80% or 90% by properly selecting the mean grain size of the material metallic powder, the oxygen content on the surface, the type of the sintering additive and sintering conditions.

Assuming that r1 and r2 represent the radii of a pair of adjacent holes 1a and b represents the width of the ceramic part 1 in an arbitrary section of the porous ceramics forming the substrate 1 according to this embodiment as shown in FIG. 1, the relation (r1+r2)/b>1 can be established. In other words, the diameter of the holes 1a can be set to at least twice the thickness of the ceramic part 1 by properly selecting the mean grain size of the material metallic powder, the oxygen content on the surface, the type of the sintering additive and the sintering conditions. More preferably, (r1+r2)/b>2. According to this structure, the dielectric loss can be further reduced.

The dielectric loss of the porous ceramics forming the substrate 1 according to this embodiment is not more than about 10-4 Flexural strength by three-point bending is at least 150 MPa, and the porous ceramics has excellent electrical and mechanical characteristics.

The microstrip line 3 is formed on the surface of the substrate 1 consisting of such porous ceramics and the base layer 5 is formed on the back surface of the substrate 1, thereby forming the microstrip substrate according to this embodiment.

While the material system for or the method of preparing the porous ceramics according to this embodiment is not particularly restricted, the inventive porous ceramics is useful as a structural material or an electronic material particularly with reference to a material such as $Si_3N_4$, $SiO_2$, AlN or $Al_2O_3$. Porous ceramics having finely dispersed homogeneous holes can be readily obtained by employing metallic powder of Si or Al as the starting material for the ceramics and prompting diffusion of the metallic element into the shell in a reaction process of nitriding or oxidizing the metallic powder.

The structure of a microstrip substrate according to a further embodiment of the present invention is now described.

Figure 9:
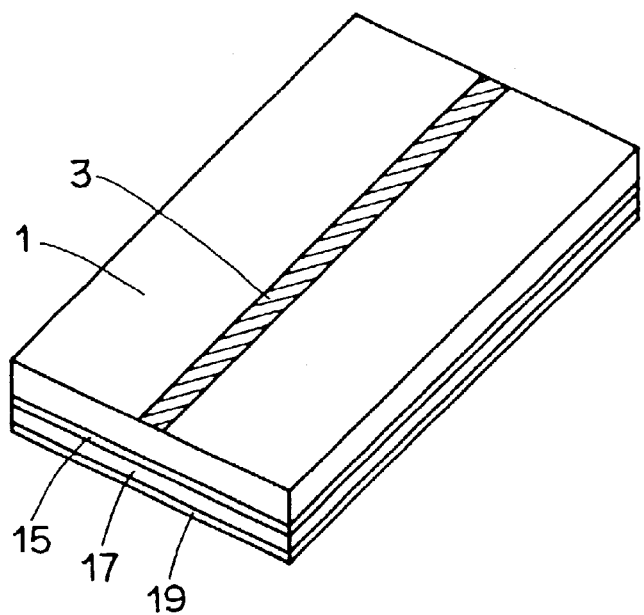
FIG. 9 is a perspective view showing a second structure of the microstrip substrate according to the present invention.
Figure 10:
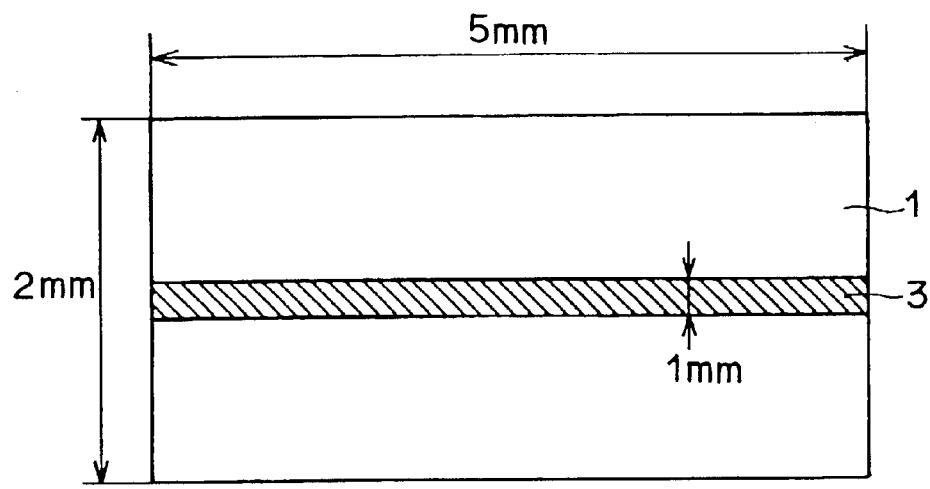
FIG. 10 is a plan view showing the second structure of the microstrip substrate according to the present invention.
Figure 11:
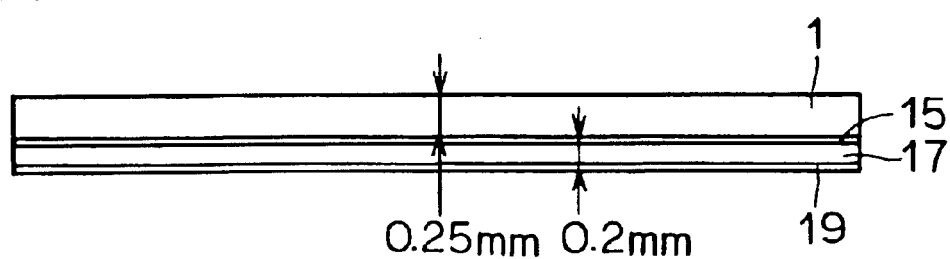
FIG. 11 is a side elevational view showing the second structure of the microstrip substrate according to the present invention.

Referring to FIGS. 9 to 11, the microstrip substrate according to this embodiment is different from the microstrip substrate according to the aforementioned embodiment in the structure of a base layer. The base layer has a glass substrate 17 and GND metallized layers 15 and 19 formed on the surface and the back surface of the glass substrate 17 respectively. The glass substrate 17 consists of $SiO_2$, for example. The GND metallized layers 15 and 19 are metallized with Au, for example. The total thickness of the glass substrate 17 and the GND metallized layers 15 and 19 forming the base layer is 0.2 mm, for example.

The remaining structure of this microstrip substrate is substantially similar to that of the aforementioned embodiment, and hence identical members are denoted by the same reference numerals and redundant description is not repeated.

Experimental examples related to this embodiment are now described.

EXPERIMENTAL EXAMPLE 11

The following five samples were first prepared:

Sample No. 71: a microstrip substrate consisting of a substrate of porous $Si_3N_4$ having porosity of 78% and a closed pore ratio of 99%

Sample No. 72: a microstrip substrate consisting of a substrate of porous AMN having porosity of 60% and a closed pore ratio of 80%

Sample No. 73: a microstrip substrate consisting of a substrate of porous $SiO_2$ of closed pores and a base layer shown in Example 1 of Japanese Patent Laying-Open No. 8-228105

Sample No. 74: a microstrip substrate consisting of an $SiO_2$ substrate shown in comparative example 1 of Japanese Patent Laying-Open No. 8-228105

Sample No. 75: a microstrip substrate consisting of only the same porous $Si_3N_4$ substrate as the sample No. 71 with no base layer.

Methods of preparing the respective samples are now described.

(A) Method of Preparing Sample No. 71

Si powder material having a mean grain size of 1 $\mu$m and a sintering additive of $Yb_2O_3$ powder having a mean grain size of 0.8 $\mu$m were prepared. At this time, the sintering additive of $Yb_2O_3$ was prepared to be 0.8 mol % with respect to the Si powder. Each powder was prepared from a commercially available one. The oxygen content on the surface of the Si powder was previously confirmed as 0.7 mol % in terms of $SiO_2$ through measurement by inert gas fusion and infrared detection.

The prepared powder materials were mixed with each other in a ball mill for 24 hours with a solvent of methyl alcohol. The obtained mixture was naturally dried and molded into a prescribed size by dry pressing. The obtained green compact was held at 1200° C. for 3 hours in a nitrogen atmosphere of the atmospheric pressure by microwave heating at a frequency of 28 GHz, thereafter heated to 1400° C. and held at this temperature for three hours, for obtaining a sintered body. The obtained sintered body was subjected to X-ray diffraction, to confirm that the same entirely consisted of $Si_3N_4$ with no residual metallic Si.

The green compact was heated in two stages since the temperature of silicon, which is nitrided by exoergic reaction ($Si+\frac{2}{3}N_2=\frac{1}{3}Si_3N_4+64$ kJ) at 1400° C., became 1400° C. or more due to its own heat generation when the same was heated to 1400° C. at once, to cause melting of Si or the like.

The sintered body was naturally dried and thereafter finished to be 5 mm in longitudinal size, 2 mm in latitudinal size and 0.25 mm in thickness.

The surface of the substrate consisting of a ceramic porous body obtained in the aforementioned manner was metallized with Au by mask deposition for forming a microstrip line. The line width of the microstrip line was set to 0.9 mm. A covar plate of 5 mm by 2 mm by 0.1 mm' was cut and plated with Au by a thickness of 2 $\mu$m on its surface to be employed as a base layer, which in turn was brazed to the back surface of the substrate for forming the microstrip substrate.

When the sintered body for forming the substrate was finished in the above, the porosity of the sintered body and the ratio of closed pores among all pores were measured. The porosity and the ratio were measured in the following manner:

Apparent density was calculated from the size and the weight of the sintered body while calculating theoretic density from the amount of the sintering additive according to the law of mixture, for obtaining the porosity as follows:

(1—apparent density/theoretical density)×100 (%)

The open pore volume was first measured with a mercury porosimeter for calculating the ratio (closed pore ratio) of closed pores among all pores as follows:

(total pore volume−open pore volume)/total pore volume×100 (%)

Consequently, the porosity of the porous $Si_3N_4$ substrate was 78%, and the closed pore ratio was 99%.

(B) Method of Preparing Sample No. 72

Al powder having a mean grain size of 5 $\mu$m and sintering additives of $Yb_2O_3$ powder having a mean grain size of 0.8 $\mu$m and MgO powder having a mean grain size of 0.5 $\mu$m were prepared. At this time, the sintering additives were so prepared that the $Yb_2O_3$ powder was 0.2 mol % with respect to the Si powder and the MgO powder was 0.6 mol % with respect to the Si powder. Each powder was prepared from a commercially available one. The oxygen content on the surface of the Al powder was previously confirmed as 0.7 mol % in terms of $Al_2O_3$ through measurement by a method similar to that in the sample No. 72.

The prepared powder materials were mixed with each other in a ball mill for 24 hours with a solvent of methyl alcohol. The obtained mixture was naturally dried and molded into a prescribed size by dry pressing. The obtained green compact was held at 900° C. for 3 hours in a nitrogen atmosphere of the atmospheric pressure by microwave heating at a frequency of 28 GHz, thereafter heated to 1250° C. and held at this temperature for 3 hours, for obtaining a sintered body. The obtained sintered body was subjected to X-ray diffraction, to confirm that the same entirely consisted of AlN with no residual metallic Al. The sintered body was naturally dried and thereafter finished to be 5 mm in longitudinal size, 2 mm in latitudinal size and 0.25 mm in thickness.

The surface of the substrate consisting of a ceramic porous body obtained in the aforementioned manner was metallized with Au by mask deposition for forming a microstrip line. The line width of the microstrip line was set to 0.5 mm. A covar plate of 5 mm by 2 mm by 0.1 mm' was cut and plated with Au by a thickness of 2 $\mu$m on its surface to be employed as a base layer, which in turn was brazed to the back surface of the substrate for forming the microstrip substrate.

When the sintered body for forming the substrate was finished in the above, the porosity of the sintered body and the ratio of closed pores among all pores were measured similarly to the sample No. 71. Consequently, the porosity of the porous AlN substrate was 60%, and the closed pore ratio was 80%.

(C) Method of Preparing Sample No. 73

First, a covar plate of 5 mm by 2 mm by 0.1 mm' was cut and plated with Au by a thickness of 2 $\mu$m on its surface. Water and ammonia serving as a catalyst were added to ethyl silicate [$Si(OC_2H_5)4$] diluted to 10 times with ethanol, for causing hydrolysis and gelation. Thus, a silica wet gel having a liquid phase part consisting of alcohol was formed. The obtained silica wet gel was introduced into a measure of 5.1 mm by 2.1 mm by 0.35 mm' in inner size prepared from glass while introducing the covar plate. The measure was supercritically dried in an autoclave under conditions of 243° C. and 6.38 MPa.

The surface of a substrate provided with a metal base obtained in this manner was metallized with Au by mask deposition, thereby forming a microstrip line of 1 mm in line width for forming the microstrip substrate.

(D) Method of Preparing Sample No. 74

The overall back surface of an $SiO_2$ substrate of 5 mm by 2 mm by 0.25 mm' was metallized while forming a microstrip line of 0.5 mm in line width on the surface by metallizing the same with Au, thereby forming the microstrip substrate.

(E) Method of Preparing Sample No. 75

A porous Si3N4 substrate was formed by the same method as that for the sample No. 71, and a microstrip line of 0.9 mm in line width was formed on the surface of this substrate by metallizing the same with Au.

As to the five samples obtained in the aforementioned manner, transmission loss was measured with a network analyzer, and airtightness was evaluated with a He (helium) leak detector.

Tables 13 and 14 show the results.

TABLE 13

| | Loss (dB) | | |
|---|---|---|---|
| | 30 GHz | 70 GHz | 110 GHz |
| Sample 71 | 0.3 | 0.4 | 0.5 |
| Sample 72 | 0.4 | 0.7 | 0.9 |
| Sample 73 | 0.6 | 2.1 | 4.2 |
| Sample 74 | 0.7 | 2.5 | 3.8 |

TABLE 14

| | Results of Evaluation of Airtightness atm · cc/sec | |
|---|---|---|
| Sample 71 | $5 \times 10^{-9}$ | ○ |
| Sample 72 | $1 \times 10^{-8}$ | ○ |
| Sample 73 | $>1 \times 10^{-5}$ | X |
| Sample 74 | $4 \times 10^{-9}$ | ○ |

It has been proved from the results shown in Tables 13 and 14 that the samples Nos. 71 and 72 exhibit small transmission loss and excellent airtightness also in a high-frequency band.

EXPERIMENTAL EXAMPLE 12

As to the samples Nos. 71 to 75 prepared in Experimental Example 11, tensile strength was measured with a tensile strength tester. Table 15 shows the results.

TABLE 15

| | Tensile Strength (kg) |
|---|---|
| Sample 71 | 20 |
| Sample 72 | 23 |
| Sample 73 | 11 |
| Sample 74 | 5 |
| Sample 75 | 7 |

It has been proved from the results shown in Table 15 that the samples Nos. 71 and 72 are higher in tensile strength than the samples Nos. 73 to 75.

EXPERIMENTAL EXAMPLE 13

In order to evaluate reliability in the atmosphere or a moistened atmosphere, aged deterioration of transmission characteristics at 30 GHz was measured in an atmosphere of 80% in humidity. Table 16 shows the results.

TABLE 16

| Time (s) | 0 | 200 | 400 | 600 | 800 | 1200 |
|---|---|---|---|---|---|---|
| Sample 71 | 0.3 | 0.3 | 0.3 | 0.3 | 0.3 | 0.3 |
| Sample 73 | 0.6 | 1.2 | 1.6 | 1.8 | 2 | 2.2 |

It has been recognized from the results shown in Table 16 that transmission characteristics at 30 GHz were not changed with time in the sample No. 71 as compared with the sample No. 73.

It is understood from the aforementioned results that the microstrip substrate according to the present invention is also applicable to usage requiring low loss and airtightness particularly in a high-frequency band, and higher strength is obtained due to provision of the base layer.

According to the microstrip substrate of this embodiment, as hereinabove described, the substrate includes a ceramic porous body having porosity of at least 30% and a ratio of closed pores of at least 50% among all pores, so that a microstrip substrate having excellent airtightness and heat resistance can be formed while reducing transmission loss in a high-frequency band without containing a component such as resin or organic matter causing loss or inhibiting airtightness.

The embodiments and Examples disclosed this time must be considered illustrative in all points and not restrictive. The scope of the present invention is shown not by the above description but by the scope of claim for patent, and it is intended that all modifications within the meaning and the range equivalent to the scope of claim for patent are included.

Industrial Applicability

The porous ceramics and the method of preparing the same according to the present invention are suitable to an electrical insulating material applied to various types of wiring circuit boards or a lightweight structural material having moisture absorption resistance.

The microstrip substrate according to the present invention is suitable to a microstrip substrate, employed for forming a waveguide for a high frequency of at least 1 GHz, particularly at least 30 GHz, formed with a microstrip line consisting of a conductor on the surface thereof.

What is claimed is:

1. Porous ceramics having relative density of lees than 70% with a ratio of closed pores of at least 50% among all pores (1a).

2. The porous ceramics according to claim 1, having relative density of less than 50% with a ratio of closed pores of at least 90% among all pores (1a).

3. The porous ceramics according to claim 1, wherein the radii r1 and r2 of a pair of adjacent holes (1a) and the width b of a ceramic part (1) between the adjacent holes satisfy a relation (r1+r2)/b>1 in an arbitrary section of said ceramics.

4. The porous ceramics according to claim 1, wherein said porous ceramics comprise a structural phase that consists of ceramics and an oxynitride phase.

5. The porous ceramics according to claim 1, wherein said ceramics contains at least one material selected from a group consisting of silicon nitride, silicon oxide, aluminum nitride and aluminum oxide.

6. A ceramic circuit board comprising a board substrate and an insulating layer consisting of the porous ceramics according to claim 1 provided on at least a portion of a surface of the board substrate.

7. Porous ceramics consisting of ceramics (1) having surface roughness (Ra) of less than 0.5 µm and porosity of at least 30%.

8. The porous ceramics according to claim 7, having a first ceramic composition at a surface thereof and a second ceramic composition different from said first ceramic composition at an interior thereof.

9. The porous ceramics according to claim 7, wherein said ceramics (1) contains at least one material selected from a group consisting of alumina, silica, silicon nitride, aluminum nitride and silicon carbide.

10. The porous ceramics according to claim 7, comprising a main phase of silicon nitride, and further comprising aluminum contained at a surface area of said ceramics.

11. The porous ceramics according to claim 7, in combination with a thin film of a metal, an oxide or a nitride on a surface of the porous ceramics.

12. The porous ceramics according to claim 7, in combination with a patterned metallic conductor formed on a surface of the porous ceramics.

13. A microstrip substrate comprising:

a substrate (1);

a microstrip line (3) consisting of a conductor formed on a front surface of said substrate (1); and a base layer (5) including at least a metallic plate or a metallized layer formed on ere a back surface of said substrate; wherein said substrate (1) includes a ceramic porous body having a porosity of at least 30% with a ratio of closed pores of at least 50% among all pores (1*a*).

14. The microstrip substrate according to claim 13, wherein said base layer has a glass substrate (17), said metallized layer (15) formed on a front surface of said glass substrate (17) and a second metallized layer (19) formed on a back surface of said glass substrate, and said metallized layer (15) is arranged to be in contact with the back surface of said substrate (1).

15. The microstrip substrate according to claim 13, wherein said ceramic porous body (1) has porosity of at least 50% with the ratio of closed pores of at least 80% among all pores (1*a*).

16. The microstrip substrate according to claim 13, wherein said ceramic porous body (1) is prepared from ceramics including at least one material selected from a group consisting of aluminum oxide, silicon nitride and aluminum nitride.

17. The microstrip substrate according to claim 13, wherein the radii r1 and r2 of a pair of adjacent holes and the width b of a ceramic part (1) between the adjacent holes satisfy a relation (r1+r2)/b>1 in an arbitrary section of said ceramic porous body (1).

\* \* \* \* \*

UNITED STATES PATENT AND TRADEMARK OFFICE
CERTIFICATE OF CORRECTION

PATENT NO.    : 6,800,360 B2
DATED         : October 5, 2004
INVENTOR(S)   : Miyanaga et al.

It is certified that error appears in the above-identified patent and that said Letters Patent is hereby corrected as shown below:

Title page,
Item [56], References Cited, FOREIGN PATENT DOCUMENTS,
replace "6/1991", by -- 8/1991 --.

Column 1,
Line 65, after "No.", replace "5-310469.discloses" by -- 5-310469 discloses --.

Column 2,
Line 46, after "accuracy", replace "(fow" by -- (low --;
Line 64, after "No.", replace "61-53146,Japanese" by -- 61-53146, Japanese --.

Column 3,
Line 23, after "issued", replace "by." by -- by --.

Column 4,
Line 44, after "conductors),", replace "t" by -- $\underline{t}$ --;
Line 45, after "and", replace "h" by -- $\underline{h}$ --;
Line 64, after "frequency", replace "f Thus," by -- f. Thus, --.

Column 6,
Line 20, after "width", replace "b" by -- $\underline{b}$ --;

Column 8,
Line 20, after "width", replace "b" by -- $\underline{b}$ --.

Column 11,
Line 16, after "and", replace "2" by -- $\underline{b}$ --;
Line 28, afer "Flexuarl", replace "10-4." by -- $10^{-4}$. --.

Column 12,
Line 2, after "to", replace "+20x1 mm" by -- ɸ 20 x 1 mm --;
Line 30, before "of" (first occurrence), replace "b" by -- $\underline{b}$ --.

Column 13,
following Table 2, replace "*comparative example"
by -- *: comparative example --;

UNITED STATES PATENT AND TRADEMARK OFFICE
CERTIFICATE OF CORRECTION

PATENT NO. : 6,800,360 B2
DATED : October 5, 2004
INVENTOR(S) : Miyanaga et al.

It is certified that error appears in the above-identified patent and that said Letters Patent is hereby corrected as shown below:

Column 14,
following Table 4, replace "*comparative example"
by -- *: comparative example --;
following Table 5, replace "*comparative example"
by -- *:comparative example --;

Column 15,
Following Table 6, replace "*comparative example"
By -- *: comparative example --;

Column 16,
following Table 7, replace "*comparative example"
by -- *: comparative example --;
following Table 8, replace "*comparative example"
by -- *: comparative example --.

Column 17,
following Table 9, replace "*comparative example"
by -- *: comparative example --;

Column 18,
Line 57, before "of", replace "if" by -- If --.

Column 20,
Line 9, before "Abrasive", replace "5 Am." by -- 5 $\mu$m. --.

Column 21,
Line 37, after "in", replace "a-nitrogen" by -- a nitrogen --.

Column 25,
Line 67, after "and", replace "b" by -- b --.

Column 26,
Line 13, after "about", replace "10-4" by -- $10^{-4}$. --.

Column 30,
Line 28, after "of", replace "lees" by -- less --.

UNITED STATES PATENT AND TRADEMARK OFFICE
CERTIFICATE OF CORRECTION

PATENT NO. : 6,800,360 B2
DATED : October 5, 2004
INVENTOR(S) : Miyanaga et al.

It is certified that error appears in the above-identified patent and that said Letters Patent is hereby corrected as shown below:

Column 31,
Line 6, after "on", delete "ere".

Signed and Sealed this

Thirty-first Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,800,360 B2
DATED : October 5, 2004
INVENTOR(S) : Miyanaga et al.

It is certified that error appears in the above-identified patent and that said Letters Patent is hereby corrected as shown below:

<u>Title page,</u>
Item [56], References Cited, FOREIGN PATENT DOCUMENTS,
replace "6/1991", by -- 8/1991 --.

<u>Column 1,</u>
Line 65, after "No.", replace "5-310469.discloses" by -- 5-310469 discloses --.

<u>Column 2,</u>
Line 46, after "accuracy", replace "(fow" by -- (low --;
Line 64, after "No.", replace "61-53146,Japanese" by -- 61-53146, Japanese --.

<u>Column 3,</u>
Line 23, after "issued", replace "by." by -- by --.

<u>Column 4,</u>
Line 44, after "conductors),", replace "t" by -- $\underline{t}$ --;
Line 45, after "and", replace "h" by -- $\underline{h}$ --;
Line 64, after "frequency", replace "f Thus," by -- f. Thus, --.

<u>Column 6,</u>
Line 20, after "width", replace "b" by -- $\underline{b}$ --;

<u>Column 8,</u>
Line 20, after "width", replace "b" by -- $\underline{b}$ --.

<u>Column 11,</u>
Line 16, after "and", replace "2" by -- $\underline{b}$ --;
Line 28, before "Flexural", replace "10-4." by -- $10^{-4}$. --.

<u>Column 12,</u>
Line 2, after "to", replace "+20x1 mm" by -- ф 20 x 1 mm --;
Line 30, before "of" (first occurrence), replace "b" by -- $\underline{b}$ --.

<u>Column 13,</u>
following Table 2, replace "*comparative example"
by -- *: comparative example --;

UNITED STATES PATENT AND TRADEMARK OFFICE
CERTIFICATE OF CORRECTION

PATENT NO.   : 6,800,360 B2  
DATED        : October 5, 2004  
INVENTOR(S)  : Miyanaga et al.

It is certified that error appears in the above-identified patent and that said Letters Patent is hereby corrected as shown below:

Column 14,  
following Table 4, replace "*comparative example"  
by -- *: comparative example --;  
following Table 5, replace "*comparative example"  
by -- *:comparative example --;

Column 15,  
Following Table 6, replace "*comparative example"  
By -- *: comparative example --;

Column 16,  
following Table 7, replace "*comparative example"  
by -- *: comparative example --;  
following Table 8, replace "*comparative example"  
by -- *: comparative example --.

Column 17,  
following Table 9, replace "*comparative example"  
by -- *: comparative example --;

Column 18,  
Line 57, before "of", replace "if" by -- If --.

Column 20,  
Line 9, before "Abrasive", replace "5 Am." by -- 5 $\mu$m. --.

Column 21,  
Line 37, after "in", replace "a-nitrogen" by -- a nitrogen --.

Column 25,  
Line 67, after "and", replace "b" by -- b --.

Column 26,  
Line 13, after "about", replace "10-4" by -- $10^{-4}$. --.

Column 30,  
Line 28, after "of", replace "lees" by -- less --.

UNITED STATES PATENT AND TRADEMARK OFFICE
CERTIFICATE OF CORRECTION

PATENT NO. : 6,800,360 B2
DATED : October 5, 2004
INVENTOR(S) : Miyanaga et al.

It is certified that error appears in the above-identified patent and that said Letters Patent is hereby corrected as shown below:

Column 31,
Line 6, after "on", delete "ere".

This certificate supersedes Certificate of Correction issued May 3, 2005.

Signed and Sealed this

Ninth Day of August, 2005

JON W. DUDAS
*Director of the United States Patent and Trademark Office*